(12) United States Patent
Muto et al.

(10) Patent No.: US 7,084,399 B2
(45) Date of Patent: Aug. 1, 2006

(54) ION BEAM APPARATUS AND SAMPLE PROCESSING METHOD

(75) Inventors: Hiroyuki Muto, Hitachinaka (JP); Tohru Ishitani, Hitachinaka (JP); Yuichi Madokoro, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/973,304

(22) Filed: Oct. 27, 2004

(65) Prior Publication Data

US 2005/0092922 A1 May 5, 2005

Related U.S. Application Data

(63) Continuation of application No. 09/794,532, filed on Feb. 27, 2001, now Pat. No. 6,792,359, and a continuation of application No. 09/794,828, filed on Feb. 27, 2001, now Pat. No. 6,822,245.

(51) Int. Cl.
*H01J 37/26* (2006.01)
(52) U.S. Cl. .................... 250/309; 250/492.21
(58) Field of Classification Search ............ 250/492.3, 250/309, 492.21, 49
See application file for complete search history.

(56) References Cited

U.S. PATENT DOCUMENTS

| | | | | |
|---|---|---|---|---|
| 4,336,597 A | * | 6/1982 | Okubo et al. .............. 702/157 |
| 4,503,329 A | * | 3/1985 | Yamaguchi et al. ........ 250/309 |
| 4,567,369 A | | 1/1986 | Smith et al. ................ 250/397 |
| 4,618,766 A | | 10/1986 | van der Mast et al. ..... 250/311 |
| 4,683,378 A | * | 7/1987 | Shimase et al. ......... 250/492.2 |
| 4,725,722 A | | 2/1988 | Maeda et al. ............... 356/624 |
| 5,061,851 A | | 10/1991 | Noguchi .................... 250/309 |
| 5,120,925 A | | 6/1992 | Ohnishi et al. ............. 219/121 |
| 5,146,090 A | | 9/1992 | Plies ......................... 250/310 |
| 5,270,552 A | | 12/1993 | Ohnishi et al. ............. 250/307 |
| 5,300,776 A | | 4/1994 | Krivanek .................... 250/307 |
| 5,825,035 A | * | 10/1998 | Mizumura et al. ...... 250/423 R |
| 5,852,297 A | | 12/1998 | Ishitani et al. ......... 250/492.21 |
| 6,067,164 A | | 5/2000 | Onoguchi et al. .......... 356/401 |
| 6,259,960 B1 | | 7/2001 | Inokuchi .................... 700/110 |
| 6,452,175 B1 | | 9/2002 | Adamec ..................... 250/310 |
| 6,583,426 B1 | | 6/2003 | Kawanami et al. .... 250/492.21 |
| 2002/0017619 A1 | | 2/2002 | Hirose et al. |

FOREIGN PATENT DOCUMENTS

| | | |
|---|---|---|
| JP | 2-061954 | 3/1990 |
| JP | 406097054 | 4/1994 |
| JP | 9-186138 | 7/1997 |
| JP | 2-708547 | 10/1997 |
| JP | 2-765829 | 4/1998 |
| JP | 2-774884 | 4/1998 |
| JP | 10-283971 | 10/1998 |
| JP | 11-258130 | 9/1999 |
| WO | WO 9913500 | 3/1999 |

* cited by examiner

*Primary Examiner*—Kiet T. Nguyen
(74) *Attorney, Agent, or Firm*—Kenyon & Kenyon LLP

(57) ABSTRACT

For the sake of realizing high throughput and high processing position accuracy in an ion beam apparatus, two kinds of ion beams for processing are prepared of which one is a focusing ion beam for high image resolution and an edge processing ion beam of large beam current for permitting a sectional edge portion to be processed sharply, whereby high processing position accuracy can be ensured even with a large current ion beam.

19 Claims, 17 Drawing Sheets

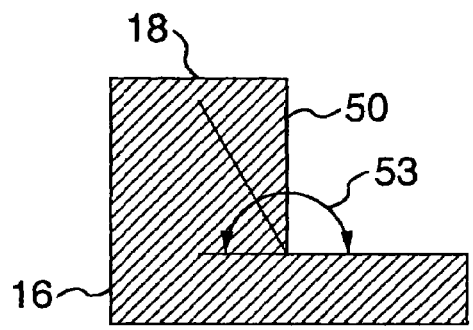
FIG. 19A
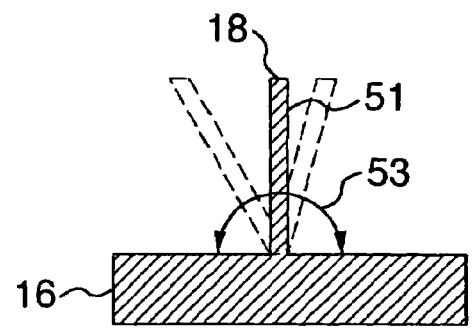
FIG. 19B
FIG. 20A
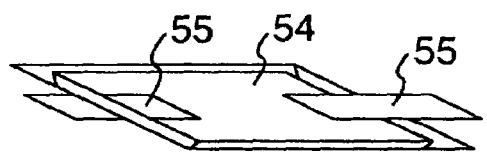
FIG. 20B
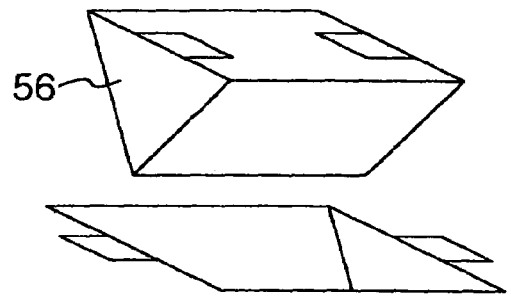
FIG. 21
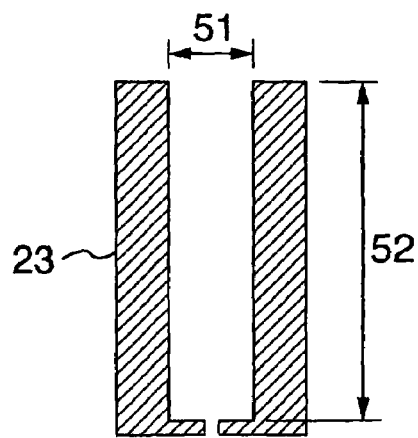
FIG. 22
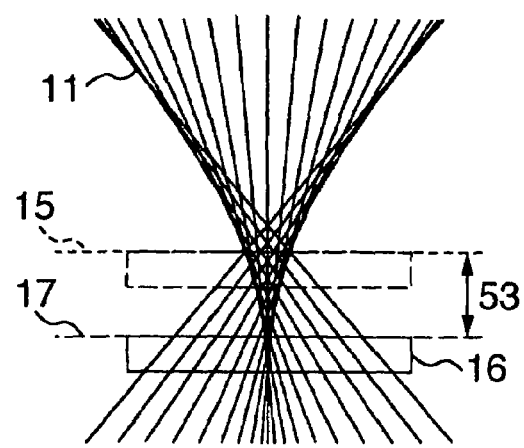

ION BEAM APPARATUS AND SAMPLE PROCESSING METHOD

This is a continuation of application Ser. No. 09/794,532, filed Feb. 27, 2001, now U.S. Pat. No. 6,792,359 and a continuation of application Ser. No. 09/794,828 filed 27 Feb. 2001 now U.S. Pat. No. 6,822,245, the content of which is incorporated herein by reference in its entirety.

BACKGROUND OF THE INVENTION

The present invention relates to ion beam apparatus and more particularly, to an ion beam apparatus used for processing a sample and a sample processing method.

As a typical example of a conventional ion beam apparatus using a focusing ion beam, a focusing ion beam processing apparatus described in U.S. Pat. No. 2,765,829 has been known. An outline of the apparatus is illustrated in FIG. 23. Ions discharged from ion generating means 201 are focused on a sample 206 by means of focusing means 202 and illuminating means 203. A restriction diaphragm 204 is adapted to determine a beam diameter. In the apparatus, three modes, that is, A, B and C modes are set in accordance with combinations of lens intensity of the focusing means and illuminating means and individual lens voltages in these modes are stored in lens control means 208 and then used. A difference in irradiation position on the sample 206 between the focusing beams in the modes A, B and C is corrected by means of beam deflecting means 205. In the apparatus, beam diameter and beam current of a focusing ion beam used for processing the sample 206 can be selected but only one focusing ion beam being in or assuming a beam focusing state for maximizing image resolution is used as the ion beam for processing.

Also, as a typical example of a processing method noticing beam distribution of the focusing ion beam, a processing method described in JP-A-2-61954 has been known. In the conventional processing method, beam distribution of a focusing ion beam focused on a target is measured through a knife-edge method and simulation is carried out in accordance with measured data to correct the dosage of ions, so that the processing depth can be stabilized to improve reliability of the processing. The processing speed depends on the beam distribution of the ion beam. Accordingly, irregularity in processing depth attributable to a change in beam distribution due to irregularity in voltage set to an electrostatic lens is taken into consideration in order to make the processing depth constant for every processing operation, thereby improving the yield of processing.

As a typical example of an ion beam apparatus using a shaped ion beam, one may refer to an ion beam processing apparatus described in JP-A-9-186138. An outline of the apparatus is illustrated in FIG. 24. Ions discharged from ion generating means 301 by means of a draw-out electrode 302 are changed in beam divergent angle by means of a beam restriction aperture 303. Lens intensity of focusing means 304 is adjusted such that the focal point of a shaped ion beam 313 coincides with a point near the center of projecting lens 307 and lens intensity of the illuminating means 307 is adjusted such that a mask 306 is projected on a sample 309. A focusing ion beam 312 can be obtained by readjusting the lens intensity of the focusing means 304 such that an intermediate focal point of the focusing ion beam 312 coincides with the mask 306, on the basis of an image of the mask 306 that is projected on the sample 309 as a result of scanning of the ion beam on the mask 306 by means of the beam deflecting means 305 and of scanning of the ion beam on the sample 309 by means of beam deflecting means 308.

In the conventional focusing ion beam processing apparatus, the beam current is ten and several nA at the most and the influence of the skirt spread in ion beam distribution does not matter in practice. For the purpose of improving the throughput, an ion beam of larger current is needed but as the current of the ion beam for processing increases, there arises a problem that the skirt spread in beam distribution increases and dullness of a sectional edge portion in a processing region becomes noticeable to prevent realization of high processing position accuracy.

In the processing method described in JP-A-2-61954, the beam distribution is not changed on the basis of a measurement result of beam distribution, that is, the lens voltage is not changed. Further, beam distribution effective to optimize the shape or form of the sectional edge portion in the processing region in accordance with desired processing is not described clearly. Accordingly, any beam distribution effective to permit the sectional edge portion to be processed sharply cannot be obtained, leading to a failure to realize the optimum processing of the sectional edge portion and the high processing position accuracy. Furthermore, simulation is used and much time is therefore required for calculation, raising a problem that high-speed response control cannot be carried out.

In the conventional ion beam apparatus using a shaped ion beam, the shaped ion beam is used for processing to realize high throughput based on large current while maintaining sectional edge sharpness comparable to or better than that obtained with the focusing ion beam but there arise problems that a focusing ion beam for observation cannot be focused and a difference in position develops between the focusing ion beam for observation and the shaped ion beam for processing. The problem that the observation focusing ion beam cannot be focused, that is, the focusing beam diameter increases upon beam switching is avoided by inserting the beam restriction aperture to change the beam divergent angle. The problem of the position difference between the observation focusing ion beam and the processing shaped ion beam is avoided by making the focal point of the focusing ion beam on a stencil mask and moving the mask so as to correct the position difference between the focusing ion beam and the shaped ion beam for processing. But it is difficult to confirm the setting accuracy of the beam restriction aperture necessary to indicate whether the aperture lies on the optical axis of ion beam optical system, leaving a problem of a position difference between the observation focusing ion beam and processing shaped ion beam attributable to insufficient setting accuracy. Besides, two mechanical drive units for the beam restriction aperture and mask are involved to raise a problem that the position difference between the two beams is aggravated. In addition, two mechanisms of the beam restriction aperture and beam deflecting means are needed as components constituting the apparatus.

As described above, in the conventional ion beam apparatus and ion beam processing method using the focusing ion beam, there arises a problem that the processing position accuracy (inclusive of the sectional edge sharpness) is degraded when the beam current is increased to increase the throughput and conversely, the throughput is degraded when the beam current is decreased to increase the processing position accuracy. In the conventional ion beam apparatus using the shaped ion beam, too, the irradiation positions of the focusing ion beam for observation and the shaped ion beam for processing cannot coincided each other with high accuracy and disadvantageously, high throughput can be attained only at the cost of degradation of the processing position accuracy. Furthermore, disadvantageously, the number of components constituting the apparatus is large.

SUMMARY OF THE INVENTION

An object of the present invention is solve the above problems and to provide an ion beam apparatus and a sample processing method which can realize both the high throughput and the high processing position accuracy.

In the present invention, two kinds of ion beams used for processing are prepared of which one is an ion beam being in or assuming a beam focusing state for high resolution of a scanning ion microscope image (hereinafter referred to as SIM image resolution), called hereinafter an ion beam for focusing/processing, and the other is an ion beam for permitting a sectional edge portion in the processing region to be processed sharply, called hereinafter an ion beam for edge processing and the two kinds of ion beams for processing are used intentionally discriminatively in accordance with the beam current to ensure compatibility between the high throughput and the high processing position accuracy.

An ion beam apparatus according to an embodiment of the invention comprises an ion beam optical system including ion generating means for generating ions, focusing means for focusing the ions generated from the ion generating means to form an ion beam, a restriction diaphragm having an opening for restricting current of the ion beam, beam deflecting means for scanning the ion beam on a sample and illuminating means for irradiating the ion beam on the sample, a specimen stage for carrying the sample, secondary particle detecting means for detecting secondary particles generated from the sample under the irradiation of the ion beam, and control means for controlling the ion beam optical system, wherein the control means controls the ion beam optical system such that an ion beam for observation necessary to form a scanning ion microscope image of the sample or an ion beam for processing necessary to process the sample is formed and also controls the ion beam optical system such that when beam current of the ion beam for processing is less than a predetermined value, a focusing/processing ion beam assuming a beam focusing state for high image resolution is formed and when the beam current of the processing ion beam is not less than the predetermined value, an ion beam for edge processing assuming a beam focusing state for permitting a sectional edge portion of the process sample to be processed sharply is formed.

The observation ion beam is rendered to be a small beam current to prevent the sample from being damaged when the sample is scanned with the observation ion beam. Preferably, the control means controls the ion beam optical system such that the edge processing ion beam is formed when the beam current of the sample processing ion beam is not less than a value at which the influence of a skirt of the ion beam becomes noticeable owing to aberration of the ion beam optical system and controls the ion beam optical system such that the focusing/processing ion beam is formed when the beam current is less than that value.

Each of the focusing means and illuminating means includes an electrostatic lens and the control means can perform switching between the focusing/processing ion beam and the edge processing ion beam by switching lens voltage of at least one of the focusing means and illuminating means.

The restriction diaphragm is a restriction aperture having an opening of circular form or a mask having an opening of desired form inclusive of a circle, the opening having an opening area for permitting current of the processing ion beam to have a value not less than the predetermined value.

The restriction diaphragm is a restriction aperture having an opening of circular form and the edge processing ion beam can be an ion beam having a least circle of confusion the position of which substantially coincides with the surface of the sample.

The restriction diaphragm is a mask having an opening of desired form inclusive of a circle, the edge processing ion beam is an ion beam having, at the sample surface position, a sectional form that is analogous to the form of opening of the mask in a direction vertical to the optical axis, and the control means has the function of forming the edge processing ion beam by controlling the lens voltage of electrostatic lens of the focusing means and that of the illuminating means and the function of forming an axis-alignment focusing/processing ion beam for high image resolution by changing the lens voltage of electrostatic lens of the illuminating means on the basis of conditions for formation of the edge processing ion beam.

Preferably, the control means controls the ion beam optical system such that the observation ion beam is formed during sample observation and process region setting and the edge processing ion beam is formed during sample processing.

The control means can include memory means for storing the relation between a value characteristic of the processing ion beam and a control value of the ion beam optical system. The characteristic value of the processing ion beam can be at least one of beam current, beam diameter and beam aperture angle of the processing ion beam.

Preferably, the control means stores, as a difference correction amount, a difference in irradiation position on the sample between the edge processing ion beam and the observation ion beam and has the function of correcting the ion beam irradiation position by using the difference correction amount such that the irradiation position of the edge processing ion beam coincides with that of the observation ion beam on the sample.

An image memory for saving an observation image of the sample observed using the observation ion beam, means for setting a process region at a desired position of the sample by using the observation image saved in the image memory and display means for displaying the set process region and the saved observation image in an overlapping fashion are provided.

Preferably, the restriction diaphragm is a restriction aperture having an opening of circular form and there is provided means for setting a scanning region of the edge processing ion beam by subtracting from the set process region an amount corresponding to a precedently determined beam radius of the edge processing ion beam when the edge processing ion beam is an ion beam having a least circle of confusion the position of which substantially coincides with the sample surface.

Preferably, display means for indicating whether the ion beam now irradiated on the sample is the observation ion beam or the processing ion beam and display means for indicating, when the ion beam now irradiated on the sample is the processing ion beam, whether the processing ion beam is the focusing/processing ion beam or the edge processing ion beam.

Preferably, when the restriction diaphragm is a mask including an opening of desired form and the edge processing ion beam is a shaped ion beam, an image memory for saving an observation image of the sample observed using the observation ion beam, means for displaying a position of the optical axis of the edge processing ion beam and a region referenced to the optical axis and scheduled to be processed by projecting the edge processing ion beam upon the sample in a fashion of overlapping with the saved observations image, and means for setting the process region by designating the position of optical axis of the edge processing ion beam such that the region scheduled for processing coincides with a desired position.

An ion beam apparatus according to another embodiment of the invention comprises, in addition to the aforementioned components, transport means for transferring an extractive sample obtained by separating part of the sample to a position different from an extractive position and an extractive sample stage for carrying the extractive sample transferred by the transport means. The control means includes desired form processing control means for processing the form of the extractive sample into a desired form including at least one of elongated lamina, rectangular prism, triangular prism and gear.

A deposition gas source for supplying a raw material gas for formation of a deposition film in the ion beam irradiation region on the sample is provided, and the control means may include beam adjusting means for forming an edge deposition processing ion beam assuming a beam focusing state similar to that of the edge processing ion beam.

The ion beam apparatus may comprise at least one upper intermediate focusing means for focusing the ion beam between the focusing means and the restriction diaphragm. At least one lower intermediate focusing means for focusing the ion beam may be interposed between the restriction diaphragm and the illuminating means.

The control means may include brightness change detecting means for detecting a change in brightness of an ion microscope image observed during processing and end point detecting means for stopping the processing at the time that the brightness change is detected.

Preferably, there is provided output gain adjusting means for adjusting the output gain of the secondary particle detecting means in accordance with the magnitude of beam current of the processing ion beam. By providing the output gain adjusting means, brightness saturation of the SIM image can be prevented.

A plurality of ion beam optical systems may be provided in which optical axes of at least two ion beam optical systems cross each other at one point. Exemplarily, an ion beam optical system for forming only the edge processing ion beam and an ion beam optical system for forming the observation ion beam and the focusing/processing ion beam may be provided.

A sample processing method according to an embodiment of the invention, adapted to process a sample by irradiating ions generated from ion generating means through an ion beam optical system, comprises the steps of performing processing by conditioning the ion beam optical system such that an image of the ion generating means is formed sharply on the sample when ion beam current is less than a predetermined value, and performing processing by conditioning the ion beam optical system such that the position of a least circle of confusion of the ion beam substantially coincides with the sample surface when the ion beam current is not less than the predetermined value.

A sample processing method according to another embodiment of the invention, adapted to process a sample by irradiating ions generated from ion generating means through an ion beam optical system including a mask having an opening of desired form, comprises the steps of performing processing by conditioning the ion beam optical system such that an image of the ion generating means is formed sharply on the sample when ion beam current is less than a predetermined value, and performing processing by conditioning the ion beam optical system such that an image of opening of the mask is formed sharply on the sample when the ion beam current is not less than the predetermined value.

BRIEF DESCRIPTION OF THE DRAWINGS

FIGS. 19A and 19B are diagrams showing examples of ion beam processing using the ion beam apparatus of the invention.

FIGS. 20A and 20B are diagrams showing examples of ion beam processing using the ion beam apparatus of the invention.

FIG. 21 is a diagram showing an example of beam current measuring means.

FIG. 22 is a diagram useful in explaining formation of the edge processing ion beam through movement of the specimen stage.

DETAILED DESCRIPTION OF THE EMBODIMENTS

Embodiments of the present invention will be described with reference to the accompanying drawings.

Embodiment 1

Figure 1:
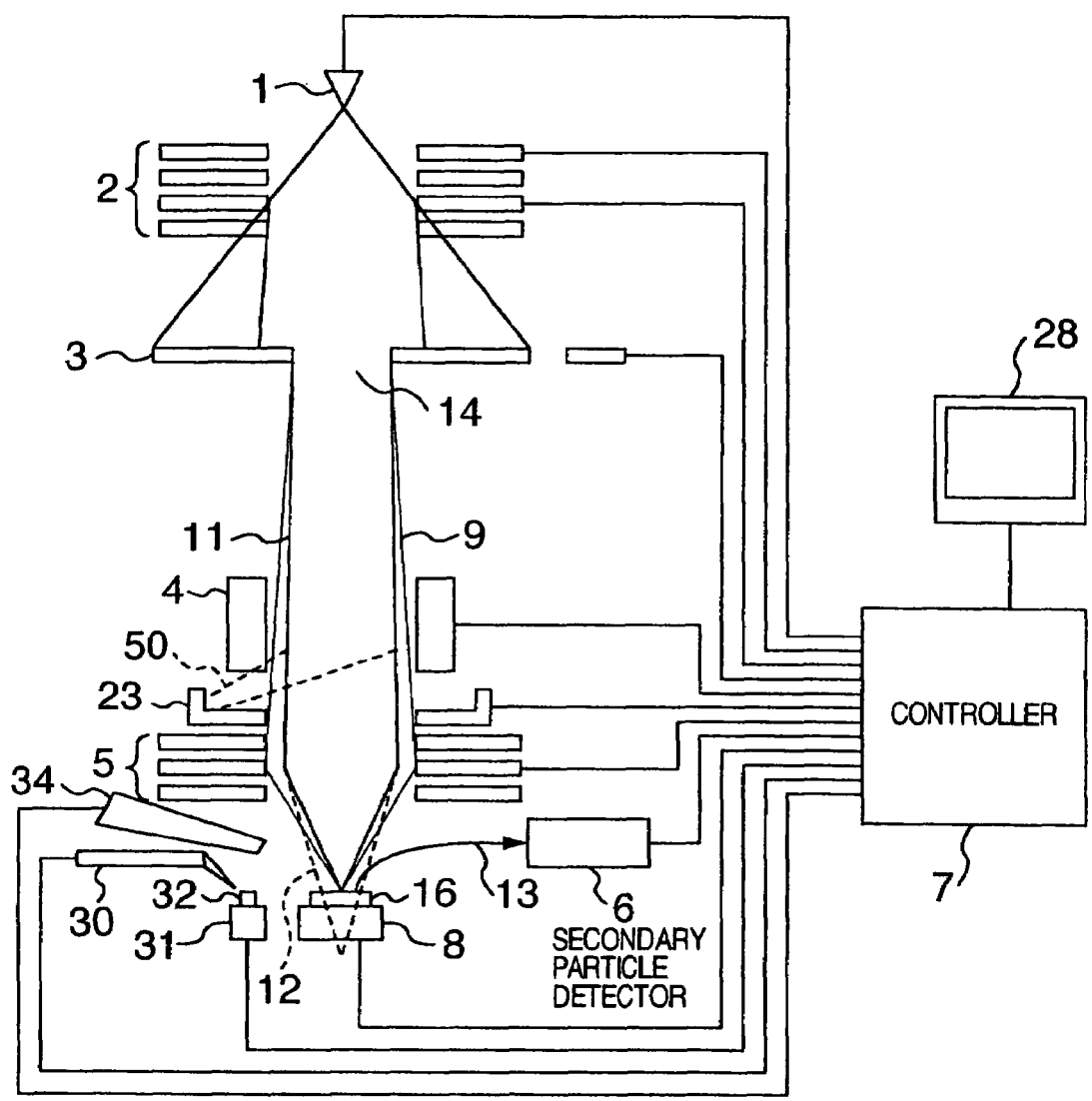
FIG. 1 is a schematic construction diagram showing an example of an ion beam apparatus of the invention having an edge processing ion beam assuming a beam focusing state approximating a least circle of confusion on the surface of a sample.

Referring to first to FIG. 1, an example of an ion beam apparatus according to the invention is schematically illustrated. The ion beam apparatus comprises ion generating means 1 using a gallium liquid metal ion source, focusing means 2 and illuminating means 5 each using a Butler type electrostatic Einzel-lens, a restriction diaphragm 3 having a plurality of apertures of different opening diameters at least one of which uses a variable aperture of opening diameter 14 for permitting the beam current to have a critical value, at which the influence of a skirt spread of beam distribution cannot be negligible in practice, or more, beam deflecting means 4 using a two-stage 8-pole deflector, a specimen stage 8 for carrying a specimen or sample 16, a secondary particle detector 6 using either a scintillator in the case of secondary particles 13 being secondary electrons or a micro-channel plate (abbreviated as MCP) in the case of secondary particles 13 being secondary ions, control means 7 using a computer and display means 28 using a cathode ray tube (CRT). The ion beam is herein classified into an ion beam for observation 9 of small beam current, an ion beam focusing/processing 11 and an ion beam for edge processing 12, that is, an ion beam assuming a beam focusing state approximating a least circle of confusion on the sample 16. Each of the variable aperture 3 and specimen stage 8 is also provided with computer-controlled XY two-axes drive and XYZTR five-axes drive mechanisms.

Beam current measuring means 23 using a simplified Faraday cup is interposed between the beams deflecting means 4 and illuminating means 5. Normally, the ion beam passes through an opening in the bottom of the beam current measuring means 23 to reach the sample 16. When a command to measure the beam current is issued from the computer of control means 7, the ion beam is deflected, from the bottom opening by means of the beam deflecting means 4 to provide a deflected ion beam 50, which in turn irradiates the inner wall of the beam current measuring means to permit the beam current to be measured. As shown in FIG. 21, the beam current measuring means 23 is so designed that the ratio between inside depth dimension 52 and upper opening diameter dimension 51, that is, (inside depth dimension 52)/(upper opening diameter dimension 51) is 5 or more. This design consideration is effective to decrease a probability that secondary particles generated by the ion beam incident upon the beam current measuring means 23 discharges to the outside of the beam current measuring means 23 and to therefore promote accuracy of beam current measurement.

Without the beam current measuring means 23, the beam current may otherwise be obtained by connecting an ammeter to the specimen stage 8 and measuring an absorption current passing through the sample 16 and specimen stage 8. In that case, however, the measurement accuracy will be degraded as compared to the case where the beam current measuring means 23 is used.

By inputting XY positions of the opening of variable aperture 3 for various kinds of ion beams and setting values of lens voltage of the focusing means 2 and illuminating means 5 to the computer and storing them therein and besides, controlling the variable aperture drive mechanism by means of the computer, individual parameters can be set automatically when one type of ion beam is switched to another. For adjustment of the ion beam, either the autofocus function is used for the necessary ion beam as in the case of the conventional apparatus or a SIM image is observed directly by the operator in order that the lens intensity can be so adjusted as to maximize the image resolution, and lens voltage and XY position of the opening of variable aperture 3 at that time are inputted to the computer and stored therein. When the ion beam for processing has a beam current not less than the aforementioned specified value (at which the influence of a skirt spread of beam distribution cannot be negligible practically in the ion beam processing), this processing ion beam is automatically set to the edge processing ion beam 12 by utilizing the stored lens voltage. Accordingly, setting of the ion beam can be implemented with operability comparable to that in the conventional apparatus. Further, automatic processing can be implemented by inputting processing data, coordinates of the specimen stage 8 and the kind of ion beam used for processing in the computer in advance and storing them therein.

In this manner, the work efficiency can be improved and thanks to the employment of the edge processing ion beam, the ion beam processing based on a conventionally unavailable large current (>15 to 25 nA) can be carried out while keeping the sharpness of a processed sectional or stepped edge portion approximated to that obtained through conventional processing based on an ion beam of about several nA, thus improving the throughput.

The edge processing ion beam 12 can be formed by decreasing lens voltage, from a lens voltage of objective lens for maximizing the image resolution, by an amount of correction for establishing the beam focusing state in which a least circle of confusion is coincident or flush with the sample surface. Next, a method of determining the voltage correction amount will be described.

Figure 12:
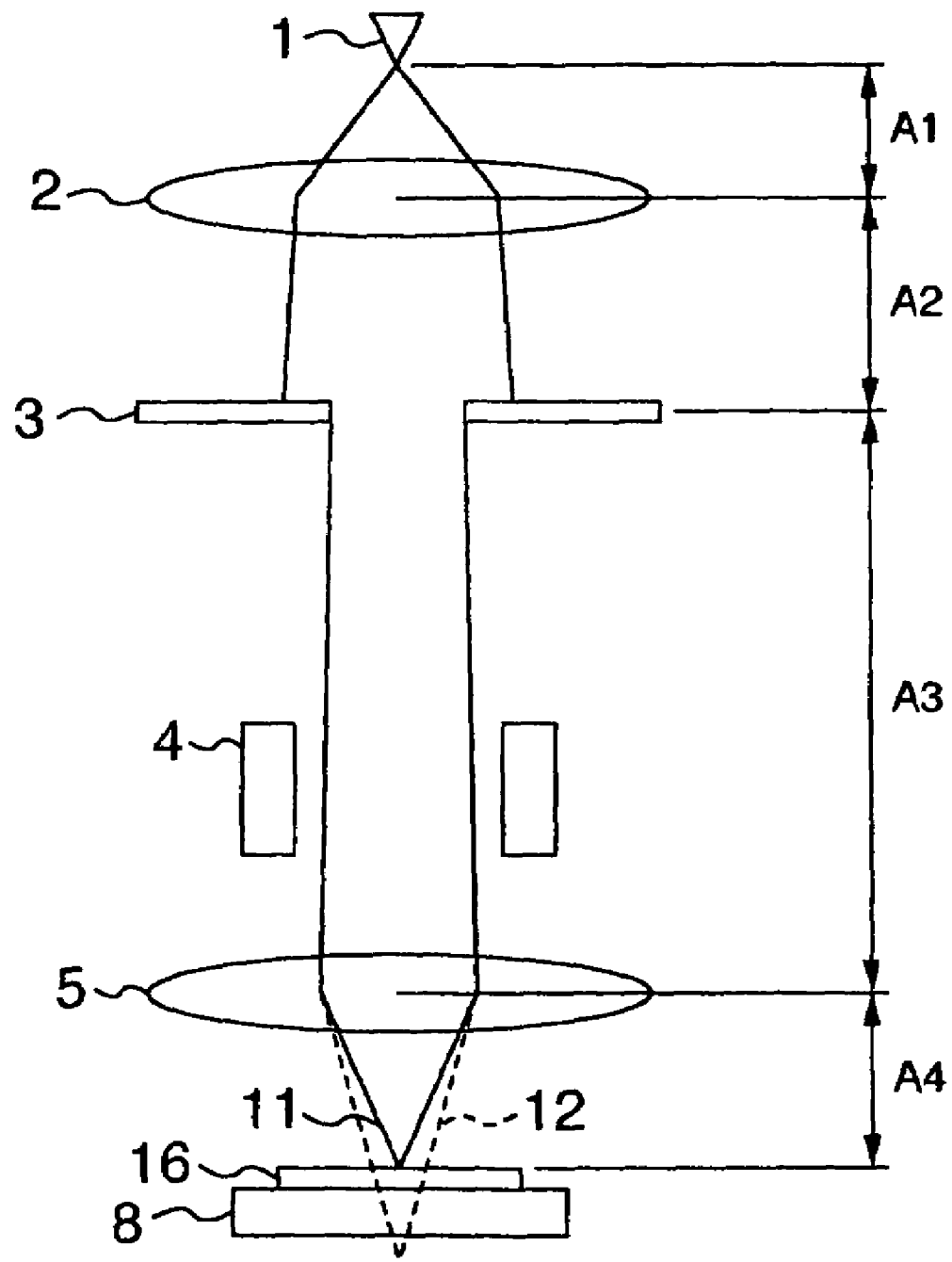
FIG. 12 is a diagram useful to explain the geometrical dimension between components constituting an optical system of the ion beam apparatus.

Firstly, an example of determining the voltage correction amount from the relation between beam current and optical system will be described. As shown in FIG. 12, geometrical dimensions A1 to A4 feature the construction of the optical system of ion beam apparatus shown in FIG. 1. In the figure, dimension A1 designates the distance between the tip of ion generating means 1 and the lens center of focusing means 2, dimension A2 designates the distance between the lens center of focusing means 2 and the restriction diaphragm 3, dimension A3 designates the distance between the restriction diaphragm 3 and the lens center of illuminating means 5 and dimension A4 designates the distance between the lens center, of illuminating means 5 and the sample surface. When the ion beam optical system of the above construction is used under conditions that accelerating voltage for the ion beam is 30 kV, the beam current has a value (for example, 15 nA) or more at which the influence of a skirt spread of beam distribution cannot be negligible practically in the ion beam processing and the surface position of the sample 16 does not change in the height direction, that is, in the optical axis direction, a voltage correction amount to be applied to lens voltage of the objective lens in order to change the beam focusing state of the ion beam irradiated on the sample 16 from a beam focusing state for maximizing the image resolution to a beam focusing state for making a near least circle of confusion coincident or flush with the sample surface is given by the following equation (1).

$$\Delta V = B1 \times Ib^2 + B2 \times Ib + B3 \quad (1)$$

where $\Delta V$ represents the voltage correction amount (unit: V) for changing the lens voltage of the objective lens from the lens voltage for maximizing the image resolution to a lens voltage for forming the edge processing ion beam 12, Ib represents the beam current (unit: nA) of the ion beam and coefficients B1, B2 and B3 represent values determined from the geometrical dimensions A1, A2, A3 and A4 of the optical system. The equation for calculation of the voltage correction amount is determined uniformly when the optical system is settled. Accordingly, by determining a calculation equation corresponding to an optical system used in advance and storing it in the computer an edge processing ion beam 12 corresponding to a desired optical system can be formed.

Here, the beam current Ib is used as a value characteristic of the processing ion beam. But, the beam current Ib is determined by the diameter of aperture opening of the restriction diaphragm 3 and with the aperture opening diameter determined, the beam aperture angle is also determined. Therefore, as the characteristic value in the equation (1), the aperture opening diameter or the beam aperture angle can be used in place of the beam current Ib.

As shown in FIG. 22, switching between the focusing/processing ion beam 11 and the edge processing ion beam 12 can be executed by moving the surface position of the sample 16 in the height direction, that is, in the optical axis direction and setting the height position to either a Gauss image plane 17 or a plane 15 on which a least circle of confusion is formed. A height position difference $\Delta Z$ between the Gauss image plane 17 and the plane 15 on which the least circle of confusion is formed is given by the following equation (2) similarly to the equation (1).

$$\Delta Z = C1 \times Ib^2 + C2 \times Ib + C3 \quad (2)$$

where coefficients C1, C2 and C3 are values determined from the geometrical dimensions A1, A2, A3 and A4 in the optical system construction shown in FIG. 12. In the equation (2), too, the aperture opening diameter or the beam aperture angle may be used as a value characteristic of the processing ion beam in place of the beam current Ib.

The ion beam apparatus contemplated by the present invention can be categorized into (1) an ion beam apparatus in which the restriction aperture having an opening of circular form is provided and the edge processing ion beam is a focusing ion beam assuming a beam focusing state for permitting the position of least circle of confusion substantially coincident with the sample surface and (2) an ion beam apparatus in which a mask having an opening of desired form inclusive of a circle is provided and the edge processing ion beam is a shaped ion beam having its section analogous to the mask opening form. The two types of apparatus will be described below.

1. Ion Beam Apparatus Provided with the Restriction Aperture Having its Opening of Circular Form Referring to FIG. 2, the schematic construction of an ion beam processing apparatus according to an embodiment of the invention is illustrated. Ions are extracted from ion generating means 1 by focusing means 2, and a condensed ion beam is selected for a desired beam current by means of a restriction diaphragm 3 and irradiated on a sample 16 carried on a specimen stage 8 by means of illuminating means 5. The ion beam is scanned by beam deflecting means 4 and secondary particles 13 generated from the sample 16 are detected by secondary particle detecting means 6 to provide a detection signal which in turn is synchronized with scanning of the ion beam by control means 7 so as to display a SIM image of the surface of the sample 16 on a display unit 28. For processing the sample 16, the ion beam is switched to an ion beam for processing by means of the control means 7.

From the standpoint of minimizing dullness of a sectional edge portion attributable to the processing, it is desirable to selectively use, from processing ion beams of the same beam current, an ion beam that has a smaller skirt spread of beam distribution even when the beam diameter (or beam half-width) increases. Accordingly, the focusing means 2 and illuminating means 5 or the illuminating means 5 alone is controlled by the control means 7 to use, as the processing ion beam, two kinds of ion beams of which one is an ion beam for focusing processing 11 having or assuming a beam focusing state for high image resolution and the other is an ion beam for edge processing 12 in which the skirt spread of beam distribution is suppressed to ensure sharp processing of the sectional edge portion of process sample. The two kinds of processing ion beams are switched for use in accordance with the beam current by means of the control means 7.

The critical value of beam current at which the influence of the skirt spread of beam distribution cannot be negligible in practice changes with the optical system. For example, in the case of an optical system of two-stage lens construction having an electrostatic lens serving as focusing means and an electrostatic lens serving as illuminating means as described in the aforementioned U.S. Pat. No. 2,765,829, this value lies between 10 nA and 20 nA. The beam current value at which the influence of the skirt spread of beam distribution cannot be negligible practically in the ion beam processing is stored in advance as a specified value in the control means 7 in order that a large current ion beam not less than the specified value can be used as edge processing ion beam 12 to thereby suppress the skirt spread of beam distribution to a great extent and assure high processing position accuracy. The employment of the edge processing ion beam 12 permits the use of a large current ion beam up to about 100 nA and higher throughput can be realized.

Figure 2:
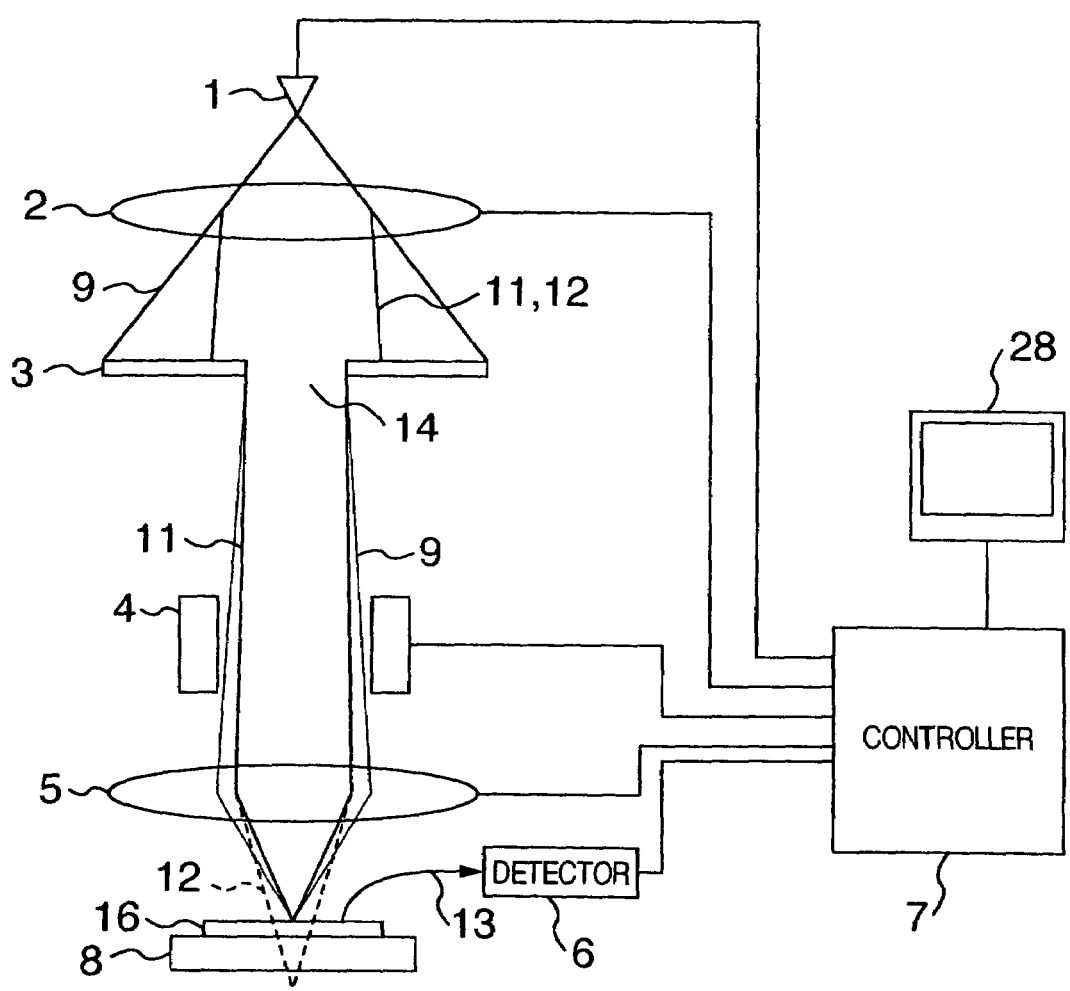
FIG. 2 is a schematic construction diagram showing an example of an ion beam processing apparatus according to the invention.

As shown in FIG. 2, for SIM image observation, an ion beam for observation 9 having its beam current limited to 100 pA or less and being in a beam focusing state for maximizing the image resolution is mainly used. When the ion beam on the side of ion generating means 1 as viewed from the restriction diaphragm 3 is noticed, the ion beam for processing (as representing focusing/processing ion beam 11 and edge processing ion beam 12) is focused toward the opening of restriction diagram by means of the focusing means 2 but the observation ion beam 9 is not focused by the focusing means 2 so as to remain in a diverging state. Accordingly, even for the same area of opening of the restriction diaphragm 3, the amount of ion beam passing through this opening is far smaller for the observation ion beam than for the focusing/processing ion beam 11. By selecting a suitable opening diameter, an observation ion beam 9 of 100 pA or less can be formed.

Figure 3:
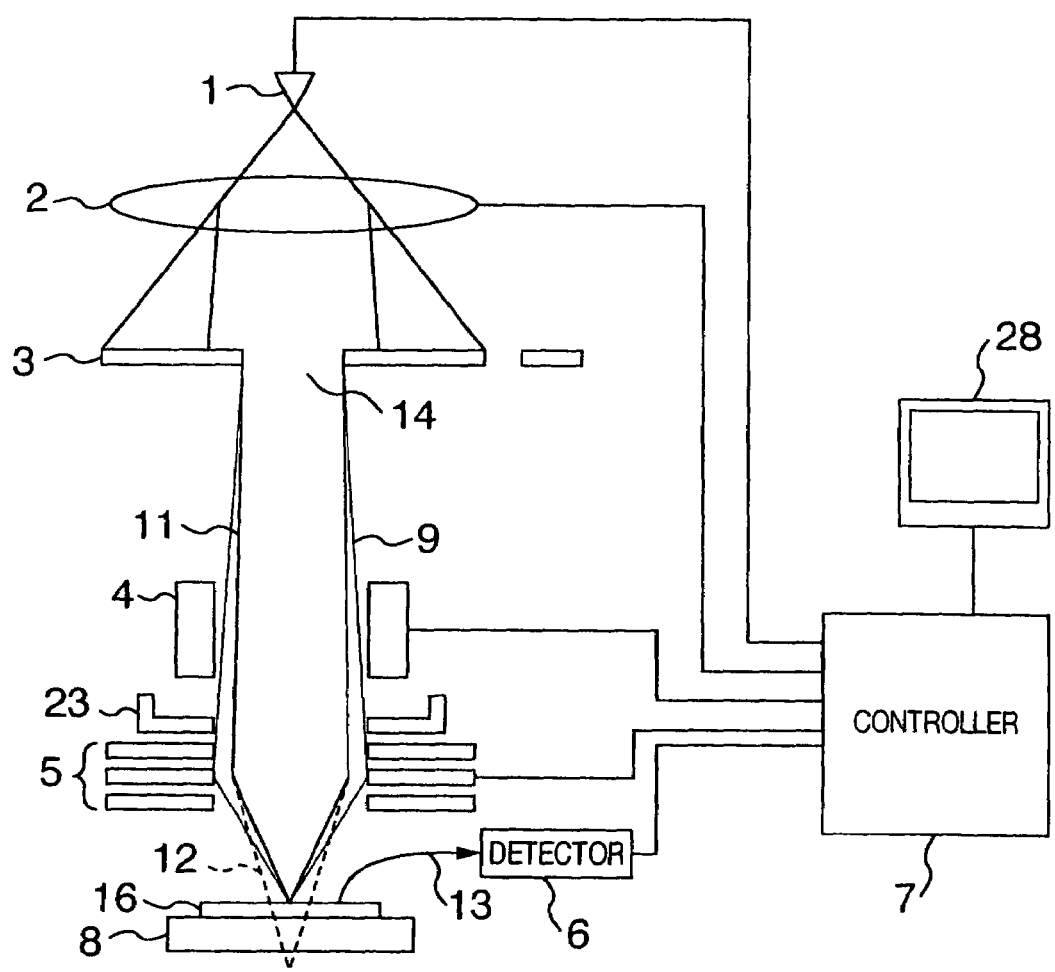
FIG. 3 is a schematic construction diagram showing an example of an ion beam apparatus of the invention in which the ion beam for processing is a focusing ion beam.

Referring to FIG. 3, the construction of an ion beam apparatus of the invention in which the ion beam for processing is a focusing ion beam is illustrated schematically. Illuminating means 5 is an objective lens comprised of an electrostatic lens and switching between focusing/processing ion beam 11 and edge processing ion beam 12 is performed by switching lens voltage applied to the objective lens. The ion beam is switched in this manner by switching the lens voltage with a view of carrying out control operation of high response capability. A restriction diaphragm 3 has at least one opening 14 of an opening area that permits the beam current of the processing ion beam to have the aforementioned specified value (beam current value at which the influence of the skirt spread of beam distribution cannot be negligible in practice) or more.

Figure 4A:
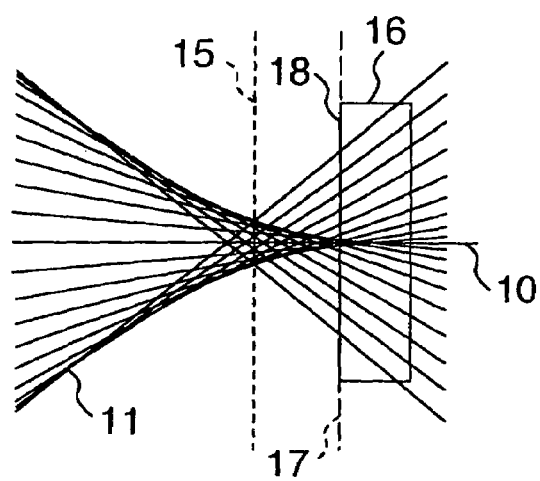
FIGS. 4A and 4B are explanatory diagrams showing a beam locus, positions of Gauss image plane and least circle of confusion of the focusing ion beam near the sample surface.
Figure 4B:
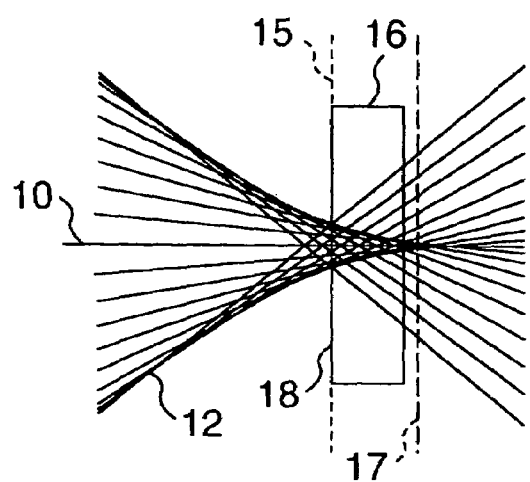

The processing ion beam in the ion beam apparatus of the invention will be described with reference to FIGS. 4A and 4B. The focusing ion beam travels on a beam locus near sample surface 18 as shown in FIGS. 4A and 4B. On the surface 18 of sample 16, the focusing/processing ion beam 11 is in a beam focusing state different from that of the edge processing ion beam 12. Of planes vertically crossing optical axis 10 of the focusing ion beam, a Gauss image plane 17 on which the image resolution is maximized and a plane 15 on which a least circle of confusion of minimum beam diameter are noticed. Here, the focusing/processing ion beam 11 is an ion beam for making the Gauss image plane 17 substantially flush with the sample surface 18 as shown in FIG. 4A and the edge processing ion beam 12 is an ion beam for making the plane 15 for formation of the least circle of confusion substantially flush with the sample surface 18 as shown in FIG. 4B. The ion beam for processing used in the conventional apparatus corresponds to the focusing/processing ion beam 11.

On the Gauss image plane 17, the ion beam has a high ion current density near the optical axis 10 but has a skirt spread of low ion current density due to aberration around the optical axis. If the beam current is small, the adverse influence attributable to the skirt can be neglected but as the beam current increases, the influence of the skirt becomes noticeable to cause dullness of sectional edge portion in the processing region to develop. The influence of the skirt is minimized on the plane 15 for formation of the least circle of confusion. By carrying out the processing with the sample surface 18 rendered to be substantially flush with the plane 15 for formation of the least circle of confusion, the dullness of the sectional edge portion in the processing region can be minimized. The ion beam in the beam focusing state as above is employed as the edge processing ion beam to solve the problem of the dullness of the sectional edge portion in the processing region.

The boundary of beam current at which the above effect fulfils itself exists between, for example, 10 nA and 20 nA as described hereinbefore and in the case of the optical system of two-stage lens construction comprised of the electrostatic lens of focusing means and the electrostatic lens of illuminating means as described in the aforementioned U.S. Pat. No. 2,765,829, the beam current is near 15 nA.

For formation of the edge processing ion beam 12, the lens voltage of objective lens for maximizing the image resolution is so corrected as to decrease slightly. The amount of voltage correction can be determined as, for example, a function from the relation between the layout dimensions of the individual components of the ion beam optical system and the size of the opening 14, beam current, beam aperture angle or beam diameter. The specified relation will be described later. This relation is determined in advance and stored in control means 7. For example, when the beam current is noticed, the beam current can be measured easily on real time base with beam current measuring means 23 as shown in FIG. 3. On the basis of a measured value, a voltage correction amount is calculated from the relation precedently stored in the control means 7 and the lens voltage of objective lens 5 is corrected, thereby ensuring that the edge processing ion beam 12 can be formed easily on real time base.

A SIM image of the sample surface is displayed on display means 28 via the control means 7. In the case of the conventional ion beam of smaller beam current, the sample surface is damaged to a negligible extent during observation of the SIM image and therefore, the ion beam used for acquisition of the SIM image utilized for setting of a processing region is the same as the ion beam for actual processing. Accordingly, any difference or displacement that cannot be neglected in practice does not develop between the set processing region and actual processing. But with the ion beam increased in the amount of current, the damage to the sample surface during observation of the SIM image with an ion beam of large current cannot be negligible in practice and acquisition of the SIM image utilized for setting the processing region and actual processing cannot be carried out with the same ion beam. As a result, a difference or displacement that cannot be practically negligible develops between the set processing region and the actual processing. Besides, since the edge processing ion beam 12 can minimize the skirt spread in beam distribution at the cost of degradation in the image resolution, necessary image resolution cannot be obtained even if the SIM image observation is carried out by using this edge processing ion beam 12, raising a problem that when the acquisition of the SIM image utilized for setting of the processing region and the actual processing are executed with the same edge processing ion beam 12, there results a merely degraded positioning accuracy.

The problems of damage to the sample surface during SIM image observation and degraded image resolution can be solved by using the observation ion beam 9 of small beam current for high image resolution to observe the SIM image utilized for setting of the processing region. But beam irradiation conditions such as lens voltage and restriction diaphragm opening diameter differ greatly for the observation ion beam 9 and edge processing ion beam 12, thus leaving behind the problem of development of an irradiation position difference on the sample. This problem will be solved in a manner to be described below. More particularly, if the beam current of the processing ion beam remains constant, then objective lens voltage of the illuminating means 5 for the focusing/processing ion beam 11 will slightly differ from that for the edge processing ion beam 12 and consequently the irradiation position difference on the sample can be negligible in practice. By taking advantage of this fact, the focusing/processing ion beam 11 for high image resolution is used as the processing ion beam for irradiation positioning on the sample of the observation ion beam 9 and edge processing ion beam 12.

Figure 5A:
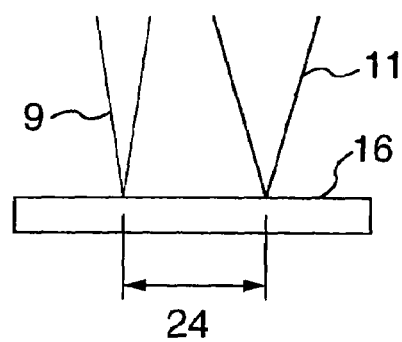
FIGS. 5A and 5B are diagrams useful to explain axis alignment of observation ion beam and edge processing ion beam.
Figure 5B:
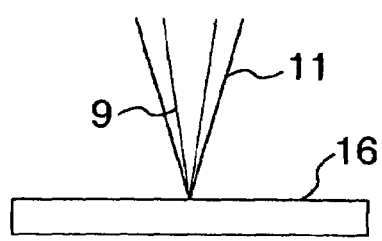

Referring to FIGS. 5A and 5B, a method for positioning correction will be described. Precedently, SIM images of a desired target on the sample 16 are observed using the observation ion beam 9 and focusing/processing ion beam 11 to measure an amount of difference correction 24 between the observation ion beam 9 and focusing/processing ion beam 11 from an amount of difference between the SIM images of the target. This difference correction amount 24 is stored in the control means 7 in advance and the irradiation position of the ion beam is corrected on the basis of the difference correction amount 24 by means of the control means 7 such that the irradiation positions of the observation ion beam 9 and focusing/processing ion beam 11 shown in FIG. 5A change to those shown in FIG. 5B in which they coincide with each other on the sample. With the irradiation positions of the observation ion beam 9 and focusing and processing ion beam 11 rendered to be coincident with each on the sample, irradiation positions of the observation ion beam 9 and edge processing ion beam 12 also coincide with each other on the sample.

As described above, the edge processing ion beam 12 for making the sample surface 18 substantially coincident with the plane 15 for formation of the least circle of confusion can be formed by making such a correction that the voltage is slightly decreased from the lens voltage of focusing lens for maximizing the image resolution through the use of the focusing means 2 (focusing lens comprised of an electrostatic lens) instead of making such a correction that the voltage is slightly decreased from the lens voltage of objective lens for maximizing the image resolution.

For the processing ion beam of the same beam current, the irradiation positioning of the observation ion beam 9 and edge processing ion beam 12 on the sample can be achieved by slightly differing the focusing lens voltage of the focusing means 2 for the focusing/processing ion beam 11 and edge processing ion beam 12 and therefore, by taking advantage of the fact that the irradiation position difference on the sample can be negligible in practice, the irradiation positioning can be achieved similarly to the above.

Figure 6:
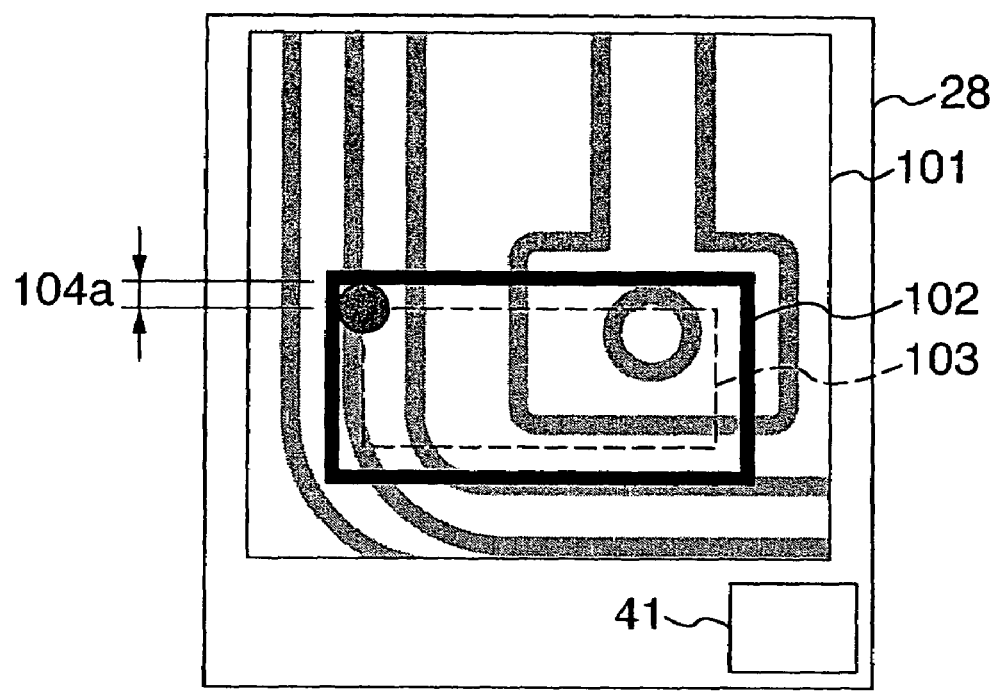
FIG. 6 is a diagram useful to explain setting of a region to be processed by the edge processing ion beam.

Referring now to FIG. 6, setting of the processing region will be described. A SIM image 101 observed using the observation ion beam 9 is stored in an image memory. This SIM image 101 is displayed on a CRT representing the display means 28 to set a desired processing region 102. The stored SIM image 101 and the processing region 102 are displayed in an overlapping fashion. A region desired to be processed corresponds to the processing region 102 but the edge processing ion beam 12 suited to optimize the processing of the sectional edge at the cost of the image resolution is larger in beam size than the normal focusing ion beam and the larger beam diameter cannot be neglected from the standpoint of processing position accuracy. If the edge processing ion beam 12 is scanned precisely along the processing region 102, a region that is larger by a beam radius 104a is processed, with the result that the processing position is displaced outward.

This problem can be solved as below. In processing with the edge processing ion beam 12, a region 103 obtained by automatically subtracting an amount corresponding to the beam radius length 104a from the set processing region 102 is scanned with the edge processing ion beam 12. In the procedures, the beam radius 104a of edge processing ion beam 12 is measured in advance and a measured value is stored in the control means 7. When the edge processing ion beam is selected as the ion beam used for processing, the measured value it used to set the scanning region 103 of the edge processing ion beam 12 resulting from subtracting the amount corresponding to the beam radius 104a from the set processing region 102 and the scanning region 103 is scanned with the edge processing ion beam 12 to thereby attain the desired high processing accuracy. The operator is simply required to set the desired processing region 102 to the SIM image displayed on the CRT regardless of the focusing/processing ion beam 11 or the edge processing ion beam 12 and hence operability comparable to that in the conventional apparatus can be maintained.

Figure 7:
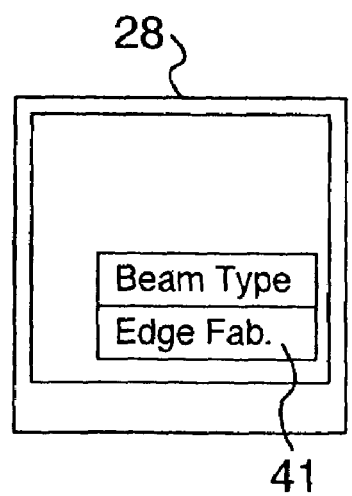
FIG. 7 is a diagram showing an example of display showing the kinds of ion beams.

Since in this ion beam apparatus the two kinds of processing ion beams, that is, the focusing/processing ion beam 11 and edge processing ion beam 12 are used, there is a possibility that these ion beams will inadvertently be misused mutually. Accordingly, a message 41 indicating the beam type as shown in FIG. 7 is displayed on the display means 28 to inform the operator of whether the ion beam now set is the observation ion beam or the processing ion beam and if the processing ion beam is now set, to inform the operator of whether the processing ion beam is the focusing/processing ion beam 11 or the edge processing ion beam 12, thereby preventing an erroneous operation.

2. Ion Beam Apparatus Provided with a Mask Having its Opening of Desired Form

Next, an ion beam apparatus of the invention will be described which is constructed substantially similarly to the ion beam apparatus described in connection with FIG. 2 and in which the restriction diaphragm 3 is replaced with a mask 19 and the edge processing ion beam 12 is replaced with an edge processing ion beam 21 represented by a shaped ion beam projecting the form of opening of the mask 19. The schematic construction of the apparatus is illustrated in FIG. 8A and a top view of an example of the mask 19 is illustrated in FIG. 8B.

Figure 8A:
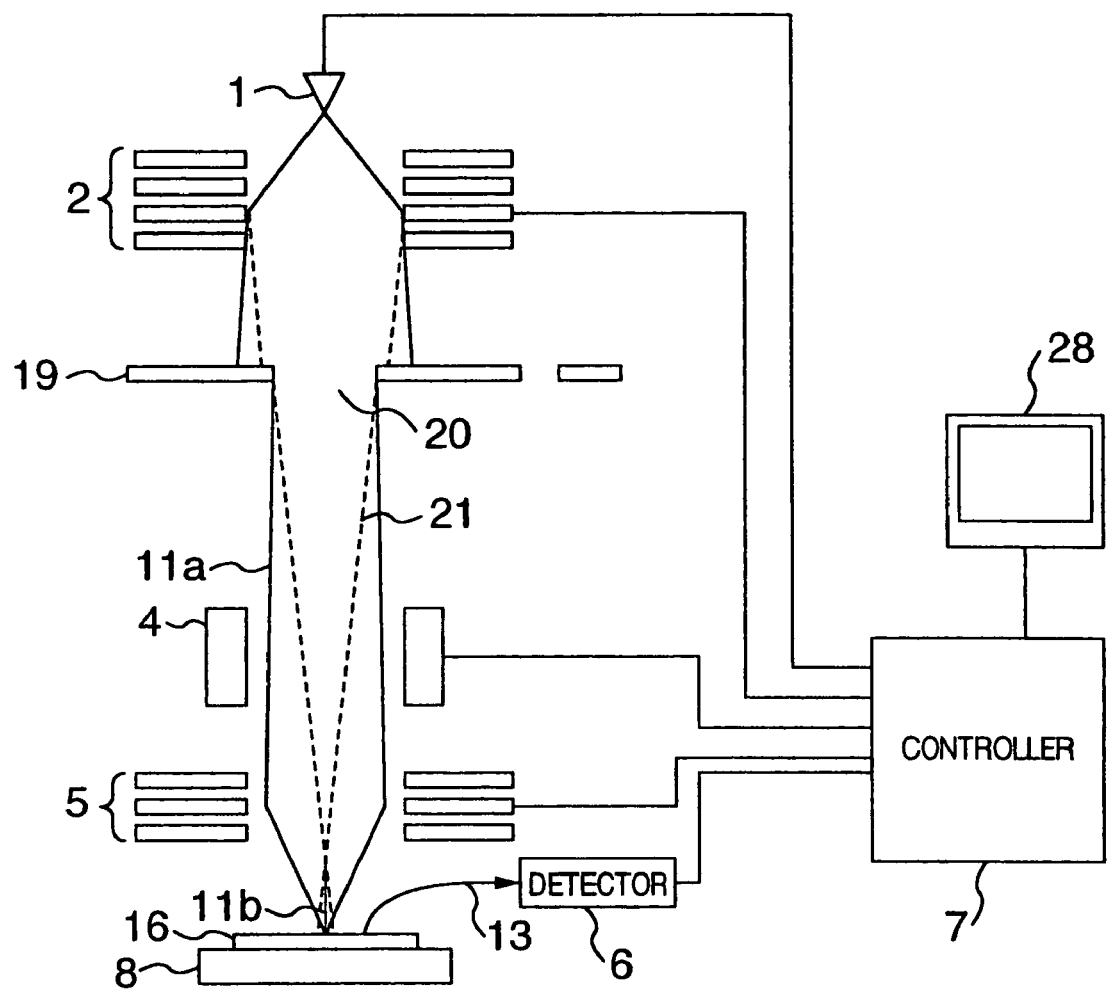
FIGS. 8A and 8B are schematic construction diagrams showing an example of an ion beam apparatus of the invention in which the processing ion beam is a shaped ion beam.
Figure 8B:
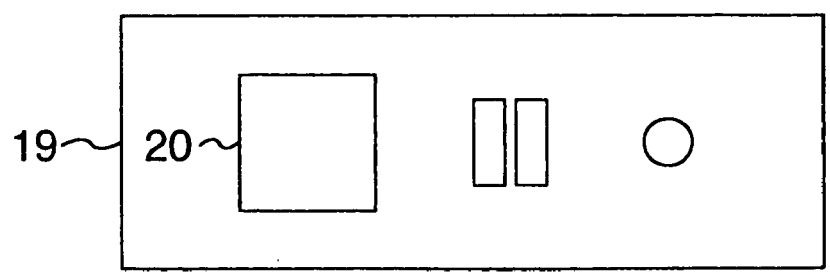

In FIG. 8A, focusing means 2 is a focusing lens comprised of an electrostatic lens and illuminating means 5 is a projecting lens comprised of an electrostatic lens. The focusing/processing ion beam 11 is classified into two ion beams of which one is a focusing/processing ion beam 11a of small current used for processing and the other is an axis-alignment focusing/processing ion beam 11b used for aligning the axis of the edge processing ion beam 21. Switching between the focusing/processing ion beam 11a and edge processing ion beam 21 is carried out by switching lens voltage applied to each of the focusing and projecting lenses. Switching between the axis-alignment focusing and processing ion beam 11b and edge processing ion beam 21 is carried out by switching lens voltage applied to the projecting lens. The mask 19 is provided with at least one opening 20 having an opening area for making the current of the processing ion beam have a critical value at which the influence of the skirt of ion beam attributable to aberration becomes noticeable, or more.

The focusing/processing ion beam 11a used for processing with small current is obtained by controlling conditions of the ion beam optical system such that an image of ion generating means 1 is formed on the sample surface. The edge processing ion beam 21 is obtained by controlling the condition of the ion beam optical system such that an image of the opening of mask 19 is formed on the sample surface.

The lens voltage for formation of the edge processing ion beam 21 is determined from arrangement dimensions of the individual components constituting the ion beam optical system. This lens voltage is determined in advance and stored in the control means 7. Upon formation of the edge processing ion beam 21, the precedently stored lens voltage is called by means of the control means 7 and then set. The axis-alignment focusing/processing ion beam 11b is obtained by focusing the edge processing ion beam 21 on the sample surface through control of the lens voltage of the projecting lens, as will be described later.

A SIM image is displayed on display means 28 via the control means 7. When the edge processing ion beam 21 is used for acquiring a SIM image used for setting a processing region, two problems takes place, of which one is that the edge processing ion beam 21 is a large current ion beam and damage to the sample surface due to beam irradiation during observation of the SIM image cannot be negligible in practice and the other is that the edge processing ion beam 21 is a shaped ion beam having a large beam width and the necessary image resolution cannot be obtained to degrade the positioning accuracy even after the SIM observation. Countermeasures against these problems are to use the observation ion beam 9 of small beam current for high image resolution. But beam irradiation conditions such as lens voltage and restriction diaphragm opening diameter differ greatly for the observation ion beam 9 and edge processing ion beam 21, so that irradiation positions of the two beams displace from each other on the specimen.

Figure 9A:
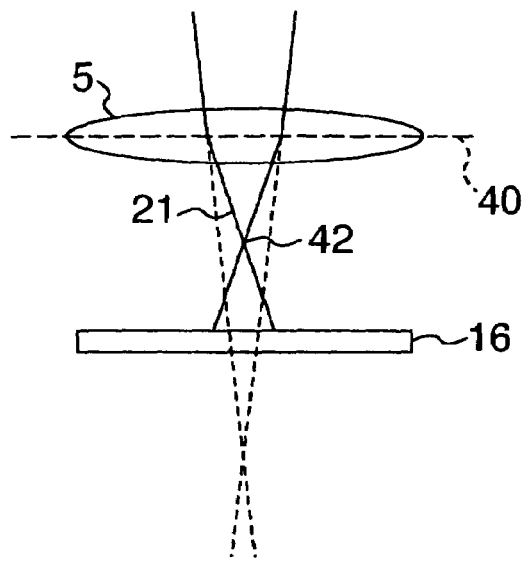
FIGS. 9A and 9B are diagrams for explaining the edge processing ion beam and an axis alignment focusing/processing ion beam.
Figure 9B:
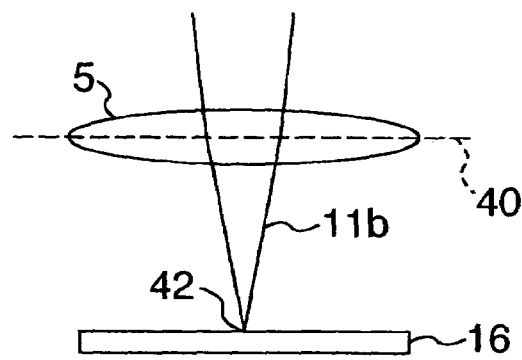

This problem will be solved as below. The edge processing ion beam 21 has its focal point 42 between a center plane 40 of projecting lens 5 and the sample 16 as shown in 9A and therefore, the beam focal point 42 can be rendered to be flush with the sample 16 by decreasing the lens voltage of the projecting lens 5 as shown in FIG. 9B. The resulting beam is used as the axis-alignment focusing/processing ion beam 11b. The projecting lens voltage for the axis-alignment focusing/processing ion beam 11b slightly differs from that for the edge processing ion beam 21 and the irradiation position displacement between the two beams on the sample can be negligible in practice. This accounts for the fact that for irradiation positioning of the observation ion beam 9 and edge processing ion beam 21 on the sample, the axis-alignment focusing/processing ion beam 11b is used in place of the latter beam.

Figure 10A:
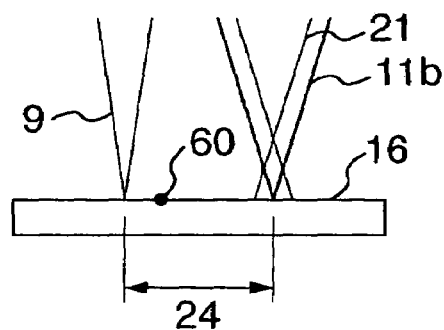
FIGS. 10A to 10D are diagrams for explaining axis alignment of the observation ion beam and edge processing ion beam.
Figure 10B:
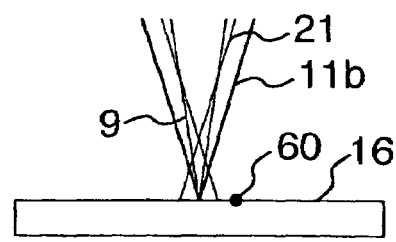
Figure 10C:
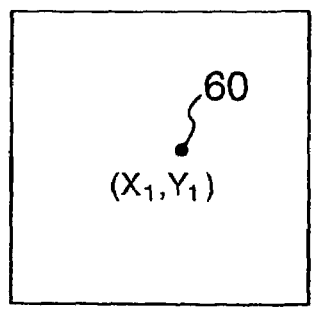
Figure 10D:
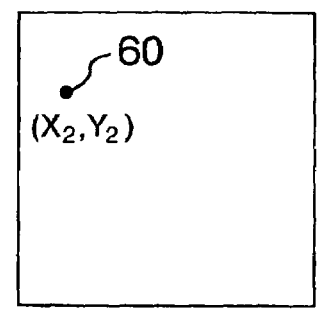

Referring to FIGS. 10A and 10B, a method for positioning correction will be described. When SIM images of a desired target 60 on the sample are observed using the observation ion beam 9 and axis-alignment focusing/processing ion beam 11b, respectively, the target 60 as viewed laterally of the sample 16 is related to the two beams as shown in FIG. 10A. The SIM images observed with the observation ion beam 9 and axis-alignment focusing/processing ion beam 11b are illustrated in FIGS. 10C and 10D, respectively. From a difference between positional coordinates on the individual SIM images of the target 60, an amount 24 for correcting the displacement between the two beams is measured. The difference correction amount 24 is stored in the control means 7 in advance and on the basis of the difference correction amount 24, a correction is made by the control means 7 such that the irradiation position of the observation ion beam 9 coincides with that of the axis-alignment focusing and processing ion beam 11b as shown in FIG. 10B. Through this, coincidence of the irradiation position of the observation ion beam 9 with that of the edge processing ion beam 21 on the sample can also be accomplished.

Figure 24:
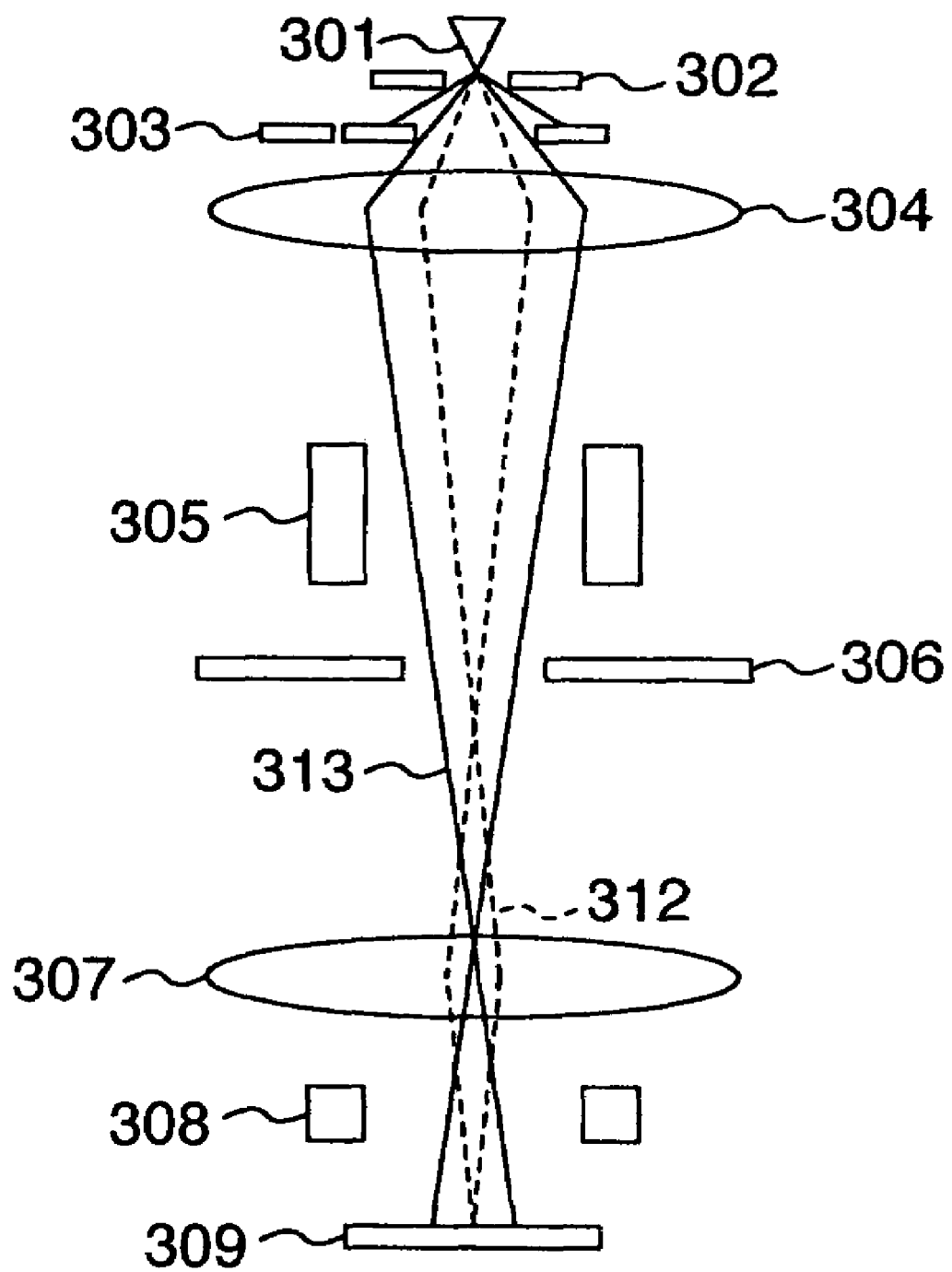
FIG. 24 is a schematic diagram of a conventional ion beam apparatus using a shaped ion beam.

In the prior art described in JP-A-9-186138 shown in FIG. 24, the focusing ion beam 312 is formed as will be described below in order to prevent the irradiation position on a sample of the focusing ion beam 312 from being displaced from that of the shaped ion beam 313. The lens intensity of illuminating means 307 is that for forming the shaped beam 313. Initially, the beam diameter of the ion beam is adjusted by means of the beam restriction aperture 303. Subsequently, while scanning the ion beam on the mask 306, the lens intensity of focusing means 304 is so adjusted as to permit the mask 306 to be observed clearly and the ion beam is focused on the mask 306. Accordingly, the restriction aperture 303 and beam deflecting means 305 are needed. In the ion beam apparatus of the present invention, the restriction aperture 303 and beam deflecting means 305 can be dispensed as will be seen from the foregoing description. In contrast to the conventional apparatus, the beam deflecting means and variable aperture can be omitted.

Figure 11A:
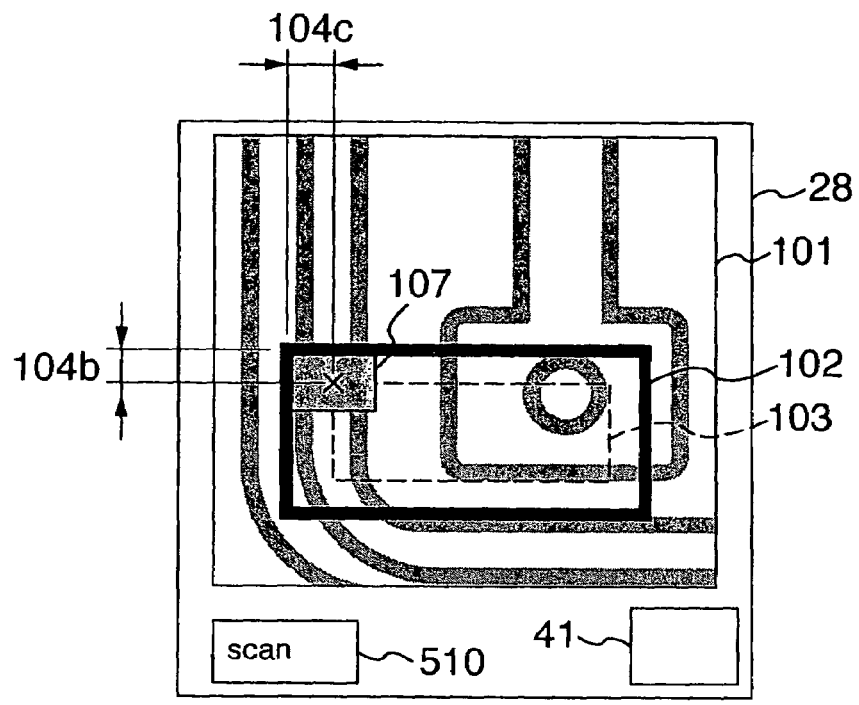
FIGS. 11A and 11B are diagrams for explaining setting of regions processed by the edge processing ion beam.
Figure 11B:
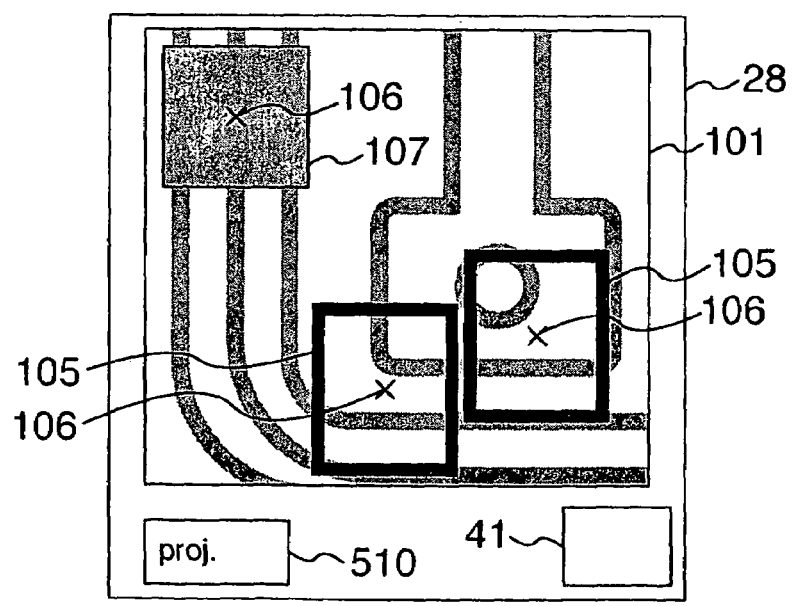

Referring to FIGS. 11A and 11B, the procedures for setting the processing region will be described. FIG. 11A shows setting operation carried out when the edge processing ion beam 21 projecting a mask of rectangular opening is scanned to process a desired processing region 102. A SIM image 101 observed using the observation ion beam 9 is saved in the image memory. The SIM image 101 is displayed on a CRT representing the display means 28 and the desired processing region 102 is set on the SIM image by means of, for example, a mouse. A region desired to be processed is the processing region 102 but the edge processing ion beam 21 forms, on the sample 16, an ion beam having a shape (projecting opening 107) corresponding to the opening of mask 19 that is reduced at a reduction ratio of the projecting lens. Therefore, if the processing region 102 is scanned precisely with the edge processing ion beam 12, the processing overruns the processing region 102 to displace the processing position outward.

This problem can be solved as below. Half 104b of the longitudinal side and half 104c of the lateral side of the opening 107 projected by the edge processing ion beam 21 are calculated or measured in advance and these values are stored in the control means 7. When the edge processing ion beam 21 is selected for processing, a region 103 to be scanned with the edge processing ion beam 21, which region results from subtracting the halved lengths 104b and 104c of the longitudinal and lateral sides of the projected opening 107 from the set processing region 102 is newly set and this scanning region 103 is scanned for processing. The operator need not distinguish the focusing/processing ion beam 11a from the edge processing ion beam 21 and is simply required to set the desired processing region 102 to the SIM, image displayed on the CRT, thus ensuring that operability comparable to that in the conventional apparatus can be maintained.

FIG. 11B shows setting carried out when a processing region 105 of the same size as that of the projected opening 107 is set (in this case, the projected opening 107 corresponds to a region scheduled to be processed). The illustration is drawn on the assumption that a mask of rectangular opening is projected. In this instance, the edge processing ion beam 21 is not scanned but is projected on a desired projecting point to process the processing region 105.

A SIM image 101 observed using the observation ion beam 9 and saved in the image memory is displayed on the CRT representing the display means 28 and a desired projecting point is set on the SIM image by means of, for example, a mouse. For the projecting point, an optical axis 106 of the edge processing ion beam 21 is determined, a projecting position of projected opening 107 referenced to the optical axis 106 is calculated or measured and the value is stored in the control means 7. On the SIM image 101 displayed on the CRT, the optical axis 106 and projected opening 107 are shadowed for display. As the position of the optical axis 106 is moved, the shadow of the projected opening 107 is concurrently moved in synchronism with the movement of the optical axis. The projecting point, that is, the position of the optical axis 106 is designated on the SIM image 101 displayed on the CRT by means of, for example, the mouse in such a manner that the projected opening 107 coincides with the desired processing region 105. The projected opening 107 is thus visualized to facilitate setting operation of the processing region 105.

There is provided selecting means 510 for selection as to whether the edge processing ion beam 21 is scanned for processing or the edge processing ion beam 21 is projected on the projecting point for processing, and a picture shown in FIG. 11A or that shown in FIG. 11B is displayed on the display means 28 as a processing region setting picture meeting the processing type selected by the selecting means 510.

In the ion beam apparatus as above, three kinds of ion beams for processing are used, that is, the focusing/processing ion beam 11a, axis-alignment focusing/processing ion beam 11b and edge processing ion beam 21 and therefore, there is a possibility that these ion beams are misused mutually. Accordingly, a message 41 indicative of the type of beam as shown in FIG. 7 is displayed on the display means 28 to inform the operator of whether the ion beam now set is the observation ion beam or the processing ion beam and if the processing ion beam is now set, inform the operator of whether the processing ion beam is the focusing/processing ion beam 11a, axis-alignment focusing/processing ion beam 11b or edge processing ion beam 12, thereby preventing erroneous operation.

Embodiment 2

Figure 13A:
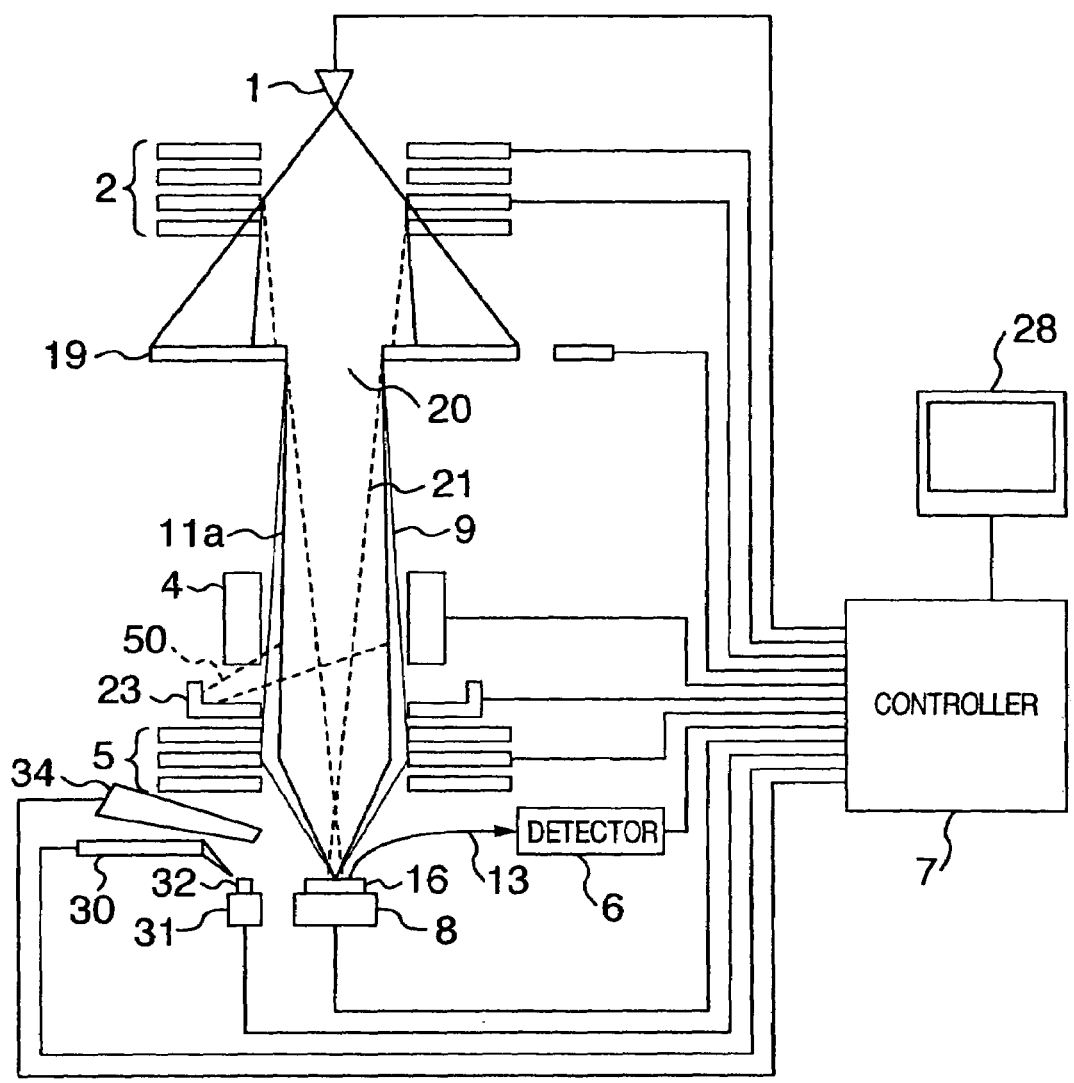
FIGS. 13A and 13B are schematic construction diagrams showing an example of an ion beam apparatus of the invention having a shaped ion beam as the edge processing ion beam.
Figure 13B:
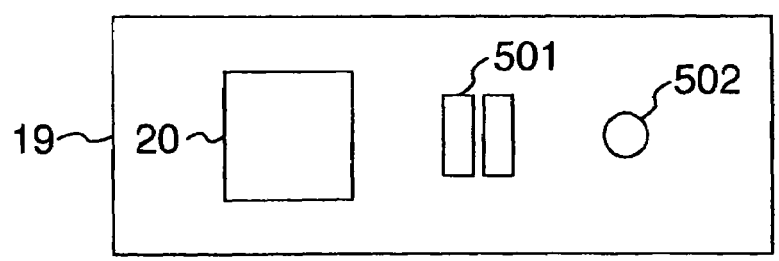

Referring now to FIGS. 13A and 13B, the construction of another example of the ion beam apparatus according to the invention is schematically illustrated. As schematically shown in FIG. 13A, the apparatus uses a mask 19 in place of the restriction diaphragm 3, and a shaped ion beam (beam for forming an image of opening of the mask on the sample surface) is used as the edge processing ion beam. FIG. 13B shows a top view of an example of the mask 19. This apparatus can be constructed substantially similarly to the apparatus according to the embodiment 1. The mask 19 has openings of desired forms, for example, a rectangular opening 20, an opening 501 constructed of two oblong holes and a circular opening 502, of which at least one is the opening having an area for acquisition of a beam current value (for example, 15 nA or more) at which the influence of the skirt spread in beam distribution cannot be negligible in practice in the ion beam processing.

In FIG. 13A, only ion beams of observation ion beam 9, focusing/processing ion beam 11a and edge processing ion beam 21 (shaped ion beam) are depicted and the axis-alignment focusing/processing ion beam 11b is omitted. Like embodiment 1, optical system parameters of various ion beams inclusive of the shaped ion beam are inputted to the computer and stored therein. The computer also controls the mask drive mechanism so that individual parameters upon switching of ion beam may be set automatically. A processing ion beam of, for example, a abeam current of 15 nA or more is automatically set to the edge processing ion beam 21 by utilizing the stored lens voltage. Accordingly, setting of the ion beam can also be implemented with operability comparable to that in the conventional apparatus. Processing data, coordinates of specimen stage 8 and the kind of ion beam used for processing are inputted in advance in the computer and stored therein to permit automatic processing, thereby improving the work efficiency. By adopting the edge processing ion beam as the shaped ion beam, the processing can be carried out with an ion beam of conventionally unused large current (usability up to a maximum of about 150 nA has been confirmed) while maintaining the sharpness of the processed sectional edge portion to the same or less sharpness obtained when the processing is carried out with the conventional ion beam approximating several hundreds of pA, thus improving the throughput.

Since the shaped ion beam is used as the edge processing ion beam, the degree of freedom to the processed form is lowered as compared to the case where the focusing ion beam is used. But, as will be seen from the focusing/processing ion beam 11a and edge processing ion beam 21 shown in FIG. 13A, the shaped ion beam is more focused than the focusing ion beam on the mask 19 by means of the focusing means 2 and on the assumption that the openings of the mask 19 and restriction diaphragm 3 have the same area, giving rise to such a merit that the beam current is larger for the shaped ion beam, that is, the processing speed is higher.

The edge sharpness of the sectional edge portion in the processing region is gradually degraded as the area of opening of the restriction diaphragm 3 (inclusive of the mask 19) increases but the degradation rate attributable to the increased area of the opening is smaller for the shaped ion beam than for the focusing ion beam assuming a beam focusing state approximating the least circle of confusion on the sample 16. Accordingly, for the same edge sharpness of the sectional edge portion in the processing region, a larger opening can be provided for the shaped ion beam. This signifies that with the edge processing ion beam for the same edge sharpness, the shaped ion beam can be an ion beam of larger current to ensure higher processing speed. Accordingly, by performing selection between the apparatus in which the ion beam assuming the beam focusing state approximating the least circle of confusion on the sample 16 is used as the edge processing ion beam and the apparatus in which the shaped ion beam is used as the edge processing ion beam in compliance with the desired processing area, processing form and processing speed, more efficient processing can be carried out.

Further, in an apparatus having, as the edge processing ion beam, both the ion beam assuming the beam focusing state approximating the least circle of confusion on the sample 16 and the shaped ion beam, the degree of freedom to the processing form is not lost and consequently, the range of selection of the processing ion beam complying with the processing can be widened and more optimal processing can be realized.

Embodiment 3

Figure 14:
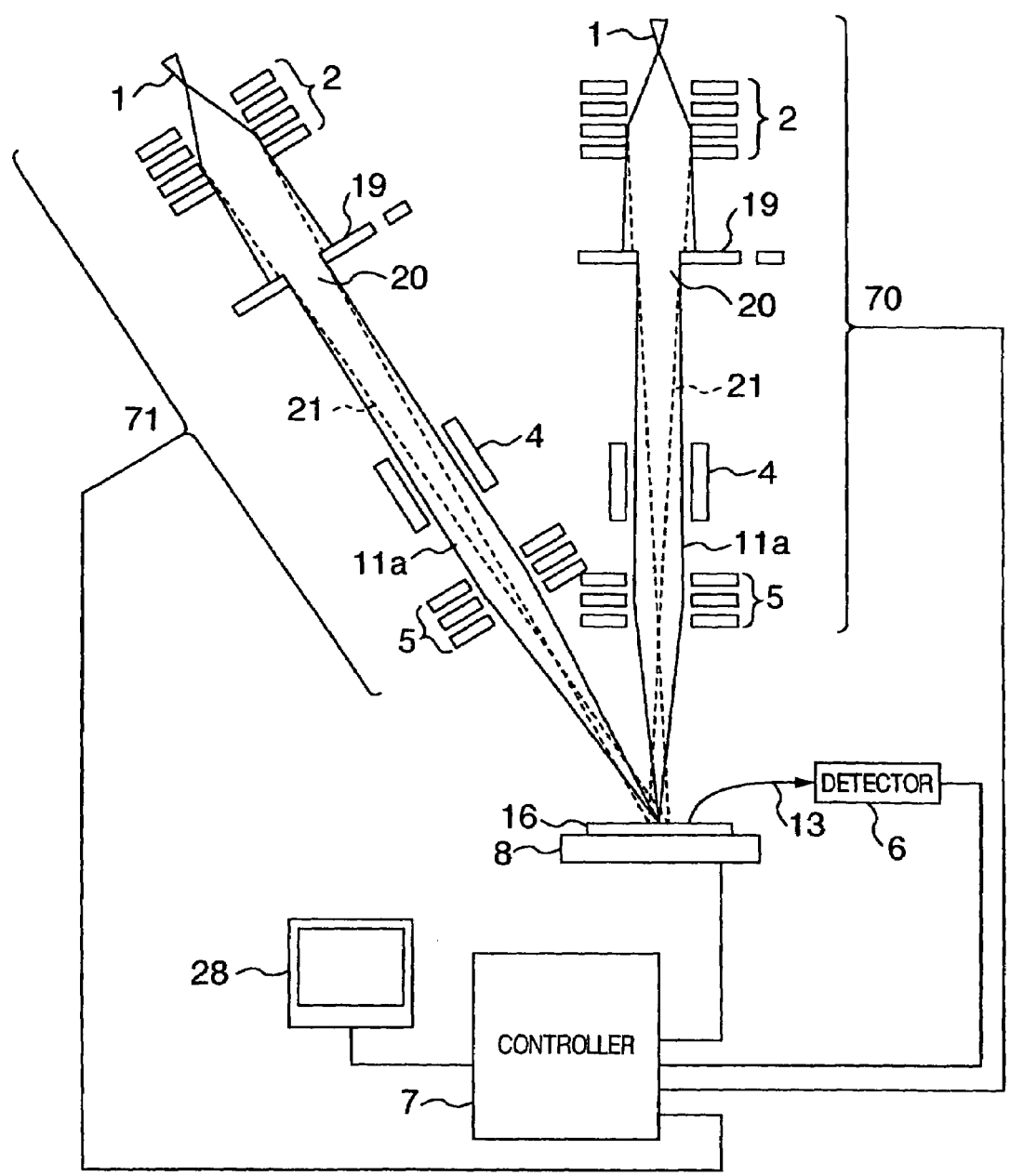
FIG. 14 is a schematic diagram showing an example of an ion beam apparatus having two ion beam optical systems.

Referring to FIG. 14, there is illustrated an example of an ion beam apparatus having two ion beam optical systems 70 and 71 each being identical to that in the embodiments 1 and 2. The two ion beam optical systems 70 and 71 are controlled by control means 7. The number of the ion beam optical systems is in no way limited to two but may be three or more. The optical axes of the respective ion beam optical systems are so arranged as to cross each other on one point on the sample 16.

Advantages of the provision of a plurality of ion beam optical systems can be enumerated as below. With the ion beam optical system arranged in an axial direction oblique to the sample, oblique processing can be conducted without inclining a specimen stage 8 and the specimen stage can dispense with the oblique shaft so as to be simplified in construction. With the two ion beam optical systems provided, two sites can be processed simultaneously to improve the throughput. Further, observation/processing on the spot for performing observation in the oblique direction while processing a section can be executed to facilitate detection of a processing end point. In addition, by arranging the two ion beam optical systems such that one of them is dedicated to edge processing ion beam 12 and the other is dedicated to observation ion beam 9 and focusing/processing ion beam 11, switching of the processing ion beam becomes unnecessary and degradation in processing position accuracy attributable to reproducibility of lens voltage and that of the position of restriction diaphragm 3 upon switching of the ion beam can be excluded. In an alternative, one of the plurality of ion beam optical systems may be replaced with an electron beam optical system.

Embodiment 4

An example of an ion beam apparatus will be described in which as described in, for example, U.S. Pat. No. 2,774,884 or JP-A-11-258130, part of a specimen is separated as an extractive sample and is so processed as to be bonded to a different sample. The construction of the ion beam apparatus is similar to that in FIG. 1 or FIGS. 13A and 13B.

As components newly added to the apparatus construction described in connection with the embodiments 1 to 3, this ion beam apparatus comprises, as shown in FIG. 1, transport means 30 for transferring an extractive sample 32 as a result of separation of part of the sample 16 to a specimen holder, an extractive sample stage 31 for carrying the extractive sample 32 transferred by means of the specimen stage 8 carrying the sample 16 and the transport means 30, and a deposition gas source 34 for supplying a raw material gas for formation of a deposition film on a region irradiated with the ion beam. By using the edge processing ion beam increased in current to realize the high-speed processing for work of separating the extractive sample 32 from the sample 16, separation of the extractive sample can be accomplished within a far shorter time in the present apparatus than in the conventional apparatus. As a result, the throughput can be improved drastically.

As described in the aforementioned prior art literature, a deposition film is formed on the irradiation region of the ion beam for the sake of protecting the surface of the extractive sample and bonding the separated extractive sample to a different sample. In the present embodiment, an edge processing ion beam 12 (or 21) of a beam current of less than 1 nA used as the ion beam dedicated to formation of the deposition film.

Figure 15A:
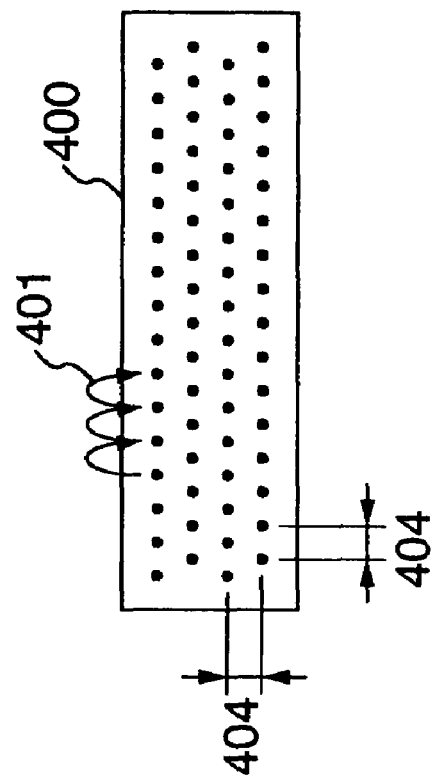
FIGS. 15A to 15D are diagrams for explaining formation of deposition films by the deposition processing ion beam.
Figure 15C:
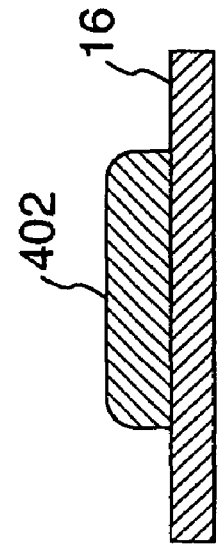
Figure 15B:
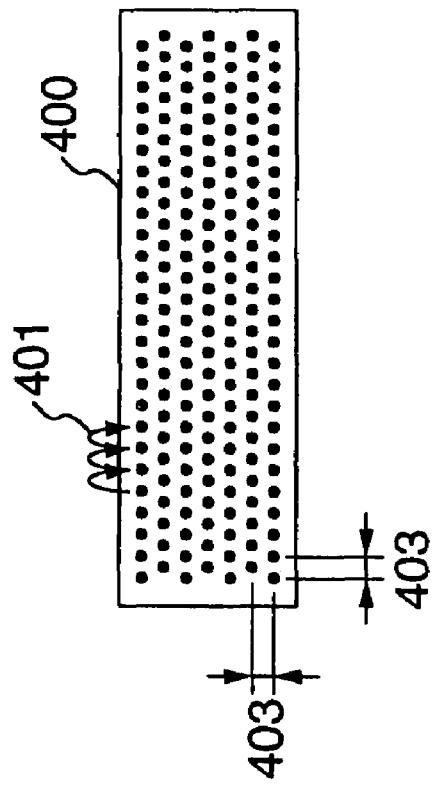
Figure 15D:
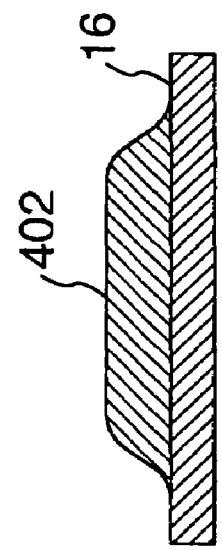

Turning to FIGS. 15A and 15B, the effects brought about by the use of the ion beam for edge deposition processing will be described. In the conventional apparatus, for formation of the deposition film, the focusing ion beam assuming a beam focusing state for high resolution of the SIM image has been used. As shown in FIG. 15A, in the conventional apparatus, a deposition film is formed through digital scan 401 in which a region 400 desired to be formed with the deposition film is digitally scanned with an ion beam at intervals of space 403. In this ion beam, a skirt of ion beam due to aberration spreads near the optical axis 10 of ion beam as has been explained with reference to FIG. 4A. The skirt of ion beam dulls a sectional edge portion of deposition film 402 as shown in FIG. 15C. Further, owing irregularity in the skirt spread of ion beam, it sometimes happens that the deposition film is formed up to a region that is slightly larger than a designated region.

In the apparatus of the invention, the ion beam for edge deposition processing having a smaller ion beam skirt spread and a larger beam diameter than those of the ion beam in the conventional apparatus is employed. Consequently, the ion beam can undergo digital scan 401 at intervals of wider space 404 than the space 403 as shown in FIG. 15B. Accordingly, the ion beam irradiation time is the same for the apparatus of the present invention and the conventional apparatus but the number of points to be irradiated can be reduced, with the result that for formation of the deposition film in the same area, the time for deposition film formation can be shorter in the apparatus of the present invention than in the conventional apparatus to thereby improve the throughput. Besides, thanks to the smaller ion beam skirt, a deposition film having a sharp sectional edge portion of deposition film 402 can be formed, contributing to preventing the deposition film forming region from being increased owing to the ion beam skirt.

Embodiment 5

Figure 16A:
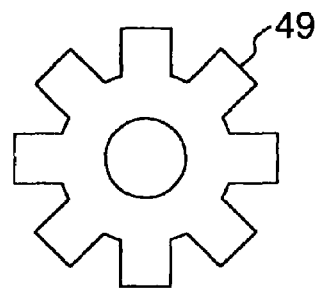
FIGS. 16A to 16F are explanatory diagrams showing an example of a desired form to be processed.

By adding, to the apparatus construction of embodiment 4, desired form processing control means additionally provided to the control means 7 so as to ensure a desired form to be processed through digital scan in which irradiation of an ion beam on the sample 16 is treated as a point and controlled digitally, the form of the extractive sample 32 can be unlimited to that indicated in the aforementioned prior art literature and the extractive sample can be processed to a desired form such as for example a gear 49 as shown in FIG. 16A used in micro-machining, so that the thus processed extractive sample can be separated and connected to a desired portion. In this case, too, the throughput can be improved as compared to that in the conventional apparatus by using the edge processing ion beam.

Figure 16B:
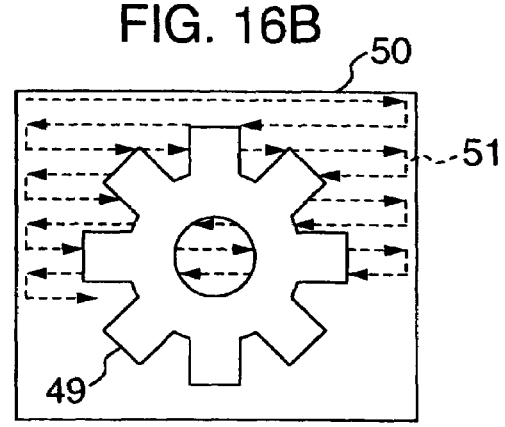
Figure 16C:
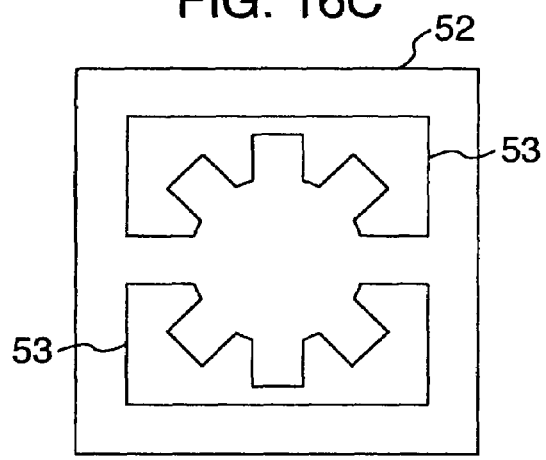
Figure 16D:
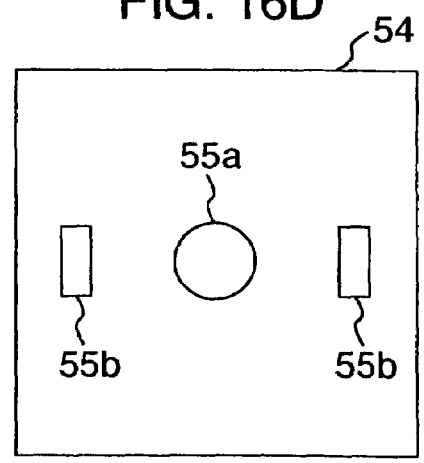
Figure 16E:
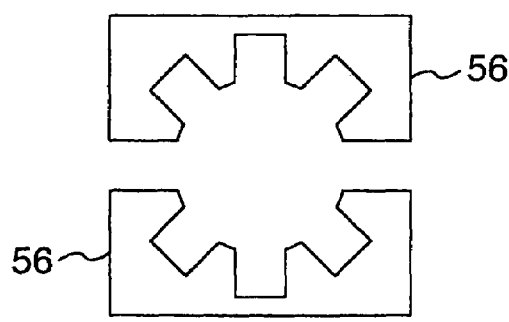
Figure 16F:
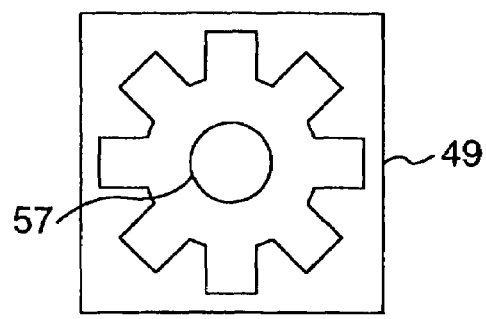

Referring to FIGS. 16B to 16F, an example of steps for making the gear 49 will be described. With the edge processing ion beam assuming the beam focusing state approximating the least circle of confusion on the sample 16 used, a gear formation region 50 is digitally scanned, as indicated by reference numeral 51, with the edge processing ion beam in such a manner that the gear 49 remains as shown in FIG. 16B. On the other hand, for the shaped ion beam representing the edge processing ion beam used, a mask 52 provided with an opening 53 contouring the gear as shown in FIG. 16C and a mask 54 provided with openings 55b for cutoff of the gear and an opening 55a contouring a shaft as shown in FIG. 16D are prepared. Initially, the gear contour is collectively processed as shown in FIG. 16E and gear shaft hole processing and cutoff are carried out collectively as shown in FIG. 16F.

Further, by using the edge processing ion beam and edge deposition processing ion beam for working such as device implantation including cutoff of device, cutoff/separation/removal of a defective portion and electrical or mechanical connection, the throughput can be improved as compared to that in the conventional apparatus.

Embodiment 6

Figure 17A:
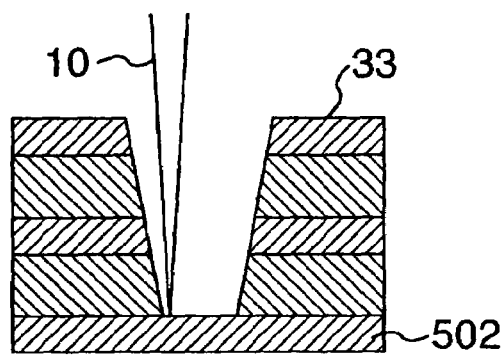
FIGS. 17A and 17B are diagrams for explaining an example of end point detection.
Figure 17B:
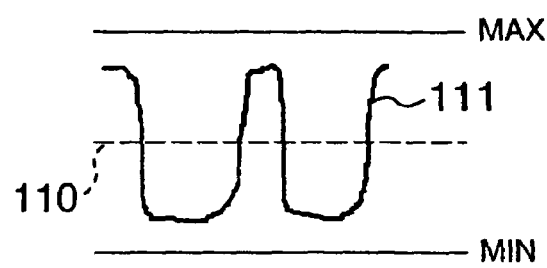

An ion beam apparatus will be described in which a lamina including a desired layer 520 of a multi-layer film sample 33 as shown in FIG. 17A is processed so as to be separated as an extractive sample by separating part of the sample as described in, for examples U.S. Pat. No. 2,774,884 or JP-A-11-258130 and bonded to a different sample. In this case, it is convenient to provide brightness change detecting means for detecting a change in brightness signal 111 of SIM image depending on a composition of each layer as shown in FIG. 17B and to provide the end point detecting function to stop the processing at a time that the brightness has changed desired times. Then, in addition to the apparatus construction in the embodiments 4 and 5, the brightness change detecting means and the end point detecting means are additionally provided to the control means 7 in order that the following steps (a) to (d) can be executed automatically at high throughput.

(a) Unneeded layers covering the desired layer 520 are removed to expose the desired layer surface.
(b) To protect the surface of the desired layer 520, a deposition film is formed on the desired layer surface.
(c) Part of a sample inclusive of the desired layer is separated as an extractive sample from the desired layer 520 and bonded to a different sample.
(d) A section or a lamina is formed at a desired position of the extractive sample bonded to the different sample.

Precedently, a threshold value 110 of brightness signal 111 and the number of excursions of the brightness signal to cross the threshold value is stored in the control means 7. For determination of a change in brightness, the brightness signal 111 is detected by secondary particle detecting means and the excursion of the brightness signal 111 to cross the threshold value 110 is monitored by the control means 7 or the number of excursions to cross the threshold value is monitored. When conditions stored in advance are satisfied, arrival at the end point is determined and the removal processing for the sample surface is stopped.

The output gain of the secondary particle detecting means 6 has an optimum value that differs depending on the beam current. Conventionally, the ion beam current used for processing changes within the range of about one figure and the output gain of the secondary particle detecting means 6 need not be adjusted in respect of individual beam currents. But the conventional output gain fixed system cannot be adaptive to the beam current change range of about two figures in the ion beam apparatus of the invention, raising a problem that the brightness of SIM image is saturated in the region where the beam current is large. This problem will be solved as below. More particularly, optimum values of output gain adaptive to the individual beam current values are determined in advance and stored in the control means 7. Upon switching of the ion beam, the output gain of the secondary particle detector 6 is switched to an optimum value in compliance with the switched beam current by means of output gain adjusting means to thereby prevent the brightness saturation of the SIM image.

Embodiment 7

Figure 18:
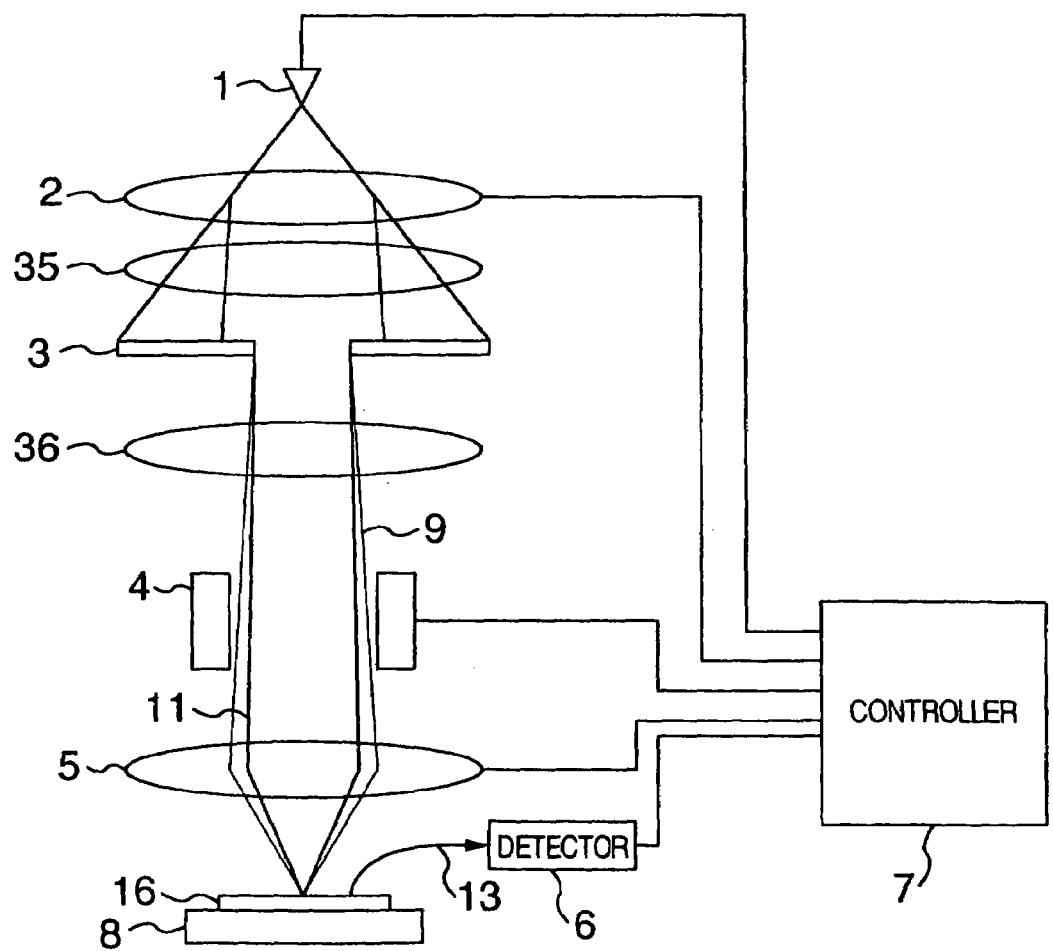
FIG. 18 is an explanatory diagram showing an example of an ion beam apparatus of the invention having upper intermediate focusing means and lower intermediate focusing means.
Figure 23:
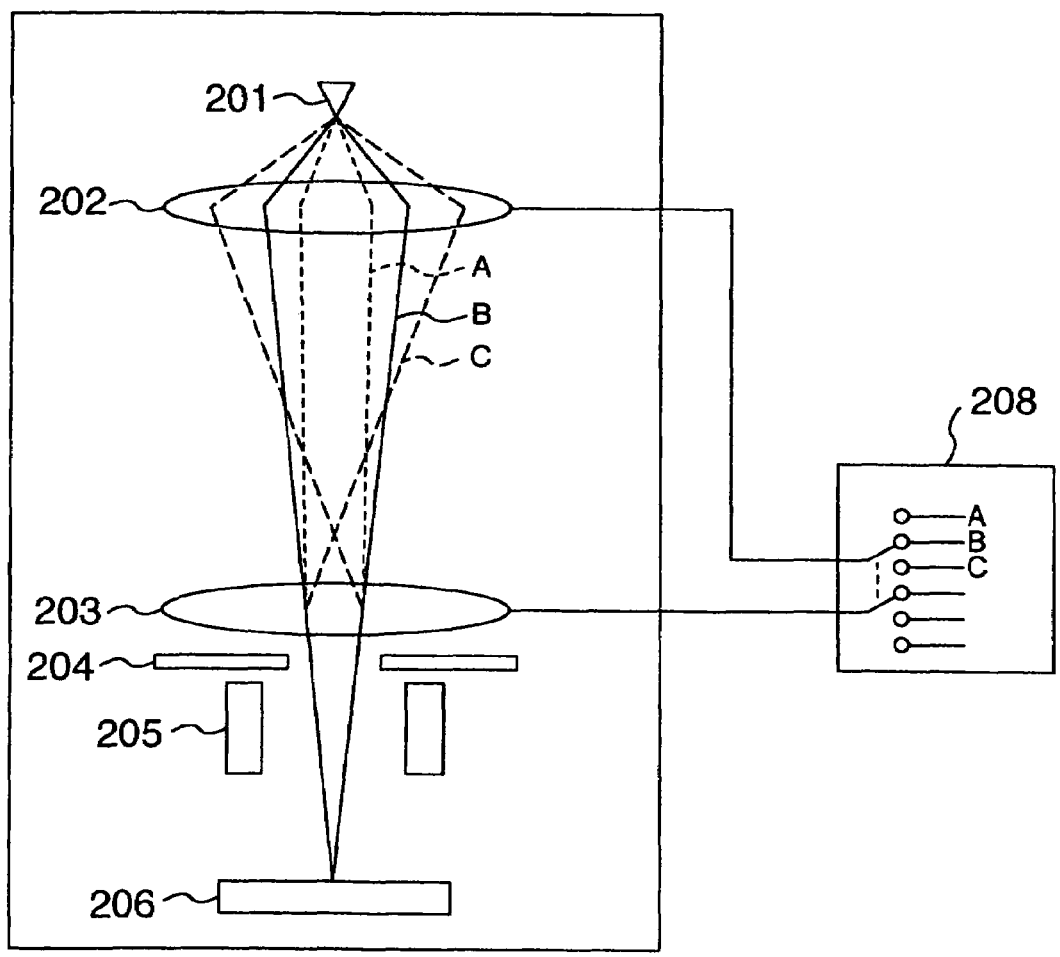
FIG. 23 is a schematic diagram of a conventional ion beam apparatus using an ion beam.

Referring to FIG. 18, another example of the ion beam apparatus according to the invention is schematically illustrated. In addition to the apparatus construction described in connection with the embodiments 1 to 6, this ion beam apparatus comprises upper intermediate focusing means 35 using a Butler type electrostatic Einzel-lens interposed between focusing means 2 and restriction diaphragm 3 (or mask 19) and lower intermediate focusing means 36 using a Butler type electrostatic Einzel-lens interposed between the restriction diaphragm 3 (or mask 19) and illuminating means 5.

By virtue of the additionally provided upper intermediate focusing means 35, the current density of an ion beam irradiating the restriction diaphragm 3 can be raised to further improve the processing throughput. Alternatively, a plurality of electrostatic lenses may be provided. By virtue of the additionally provided lower intermediate focusing means 36, the reduction rate of the opening of mask 19 can be changed. In the shaped ion beam, an opening having an area larger than that of the conventional opening can be used by increasing the reduction rate to thereby increase the beam current of ion beam. Accordingly, the processing speed can be increased to further improve the throughput. Alternatively, a plurality of electrostatic lenses can be provided.

Even with any one of the upper intermediate focusing means 35 and lower intermediate focusing means 36 provided, the effects described above can be attained.

Embodiment 8

Referring to FIGS. 19A and 19B, there is illustrated an example of ion beam processing using the ion beam apparatus described in connection with the foregoing embodiments. A section 50 or a laminar 51 is processed in a sample 16. Given that an angle of 90° is defined in a direction vertical to a perpendicular set up on the sample surface 18, the section or laminar surface is so processed as to lie within a range 53 of from 0° to 180° as measured clockwise. In some applications, the section 50 or lamina 51 may be processed in the extractive sample 32.

Referring to FIG. 20A, there is illustrated another example of ion beam processing using the ion beam apparatus of the present invention. This processing example outlines the ion beam processing indicated in, for example, JP-A-5-52721 or U.S. Pat. No. 2,708,547 in which wiring lines 55 of a device sample 54 are cut, connected or implanted. As shown in FIG. 20B, the ion beam apparatus of the invention can also be used in ion beam processing for separation and removal of a defective portion 56.

In the processing explained in connection with the embodiment 4 in which part of the sample is separated as an extractive sample and bonded to a different sample, work time required for separating part of the sample as the extractive sample has been noticed and a maximum work time for a plurality of operators to continue working without suffering from stress has been examined. Results have shown that the maximum work time is about 30 minutes on average. By using the ion beam apparatus of the invention, the work time required to separate the extractive sample from the sample, which is conventionally 60 minutes or more, can be reduced to 30 minutes or less and stress imposed on the operator can be relieved.

According to the present invention, two kinds of processing ion beams used for processing are provided including the focusing/processing ion beam assuming a beam focusing state for high image resolution and the edge processing ion beam for sharply processing the sectional edge portion in the processing region, whereby for a large current ion beam, the edge processing ion beam is used to ensure compatibility between high throughput and high processing position accuracy.

The invention claimed is:

1. An ion beam apparatus comprising an ion beam optical system including ion generating means for generating ions, focusing means for focusing the ions generated from said ion generating means to form an ion beam, a restriction diaphragm having an opening for restricting current of said ion beam, beam deflecting means for scanning said ion beam on a sample and illuminating means for irradiating said ion beam on the sample, a sample stage for carrying the sample, secondary particle detecting means for detecting secondary particles generated from the sample under the irradiation of said ion beam, and control means for controlling said ion beam optical system, wherein said control means controls said ion beam optical system such that an ion beam for observation necessary to form a scanning ion microscope image of the sample or an ion beam for processing necessary to process the sample is formed and also controls said ion beam optical system such that when a beam current of the ion beam for processing is less than a predetermined value, a focusing/processing ion beam assuming a beam focusing state for high image resolution is formed and when the beam current of the processing ion beam is not less than the predetermined value, an ion beam for edge processing assuming a beam focusing state for permitting a sectional edge portion of the process sample to be processed sharply is formed, wherein said control means sets a desired processing region on a SIM image displayed on a CRT without regard to whether the focusing/processing ion beam or the edge processing ion beam is in use; and measures the beam radius of the edge processing ion beam in advance and stores a measured value in the control means wherein said control means, when processing with the edge processing ion beam, scans a region, obtained by automatically subtracting an amount corresponding to the stored beam radius from the set processing region, with the edge processing ion beam to thereby attain a desired high processing accuracy.

2. The ion beam apparatus according to claim 1 wherein said control means is further adapted to generate a message indicating the beam type and further including a display on which said message is displayed to inform the operator of the type of beam presently set.

3. The ion beam apparatus according to claim 2 wherein said message indicates whether the ion beam now set is an observation ion beam or a processing ion beam and if the processing ion beam is now set, to inform the operator of whether the processing ion beam is the focusing/processing ion beam or the edge processing ion beam, thereby preventing an erroneous operation.

4. The ion beam apparatus according to claim 1 wherein said control means is further adapted to generate a message indicating the beam type and further including a display on which said message is displayed to inform the operator of the type of beam presently set.

5. The ion beam apparatus according to claim 4 wherein said message indicates whether the ion beam now set is an observation ion beam or a processing ion beam and if the processing ion beam is now set, to inform the operator of whether the processing ion beam is the focusing/processing ion beam or the edge processing ion beam, thereby preventing an erroneous operation.

6. The ion beam apparatus according to claim 5 wherein said control means, when processing with the ion beam of larger radius scans a region, obtained by automatically subtracting an amount corresponding to the stored beam radius from the set processing region, with the larger radius ion beam to thereby attain a desired high processing accuracy.

7. The ion beam apparatus according to claim 6 wherein said control means is further adapted to generate a message indicating the beam type and further including a display on which said message is displayed.

8. The ion beam apparatus according to claim 7 wherein said message indicates whether the ion beam now set is an observation ion beam or a processing ion beam and if the processing ion beam is now set, to inform the operator of the size of the processing ion beam, thereby preventing an erroneous operation.

9. An ion beam apparatus comprising an ion beam optical system including an ion source, an objective lens for focusing an ion beam emitted from said ion source, and a scanning and deflecting unit for scanning said ion beam on a sample, and a detector for detecting secondary particles generated from the sample under the irradiation of said ion beam, and a control unit for controlling said ion beam optical system, wherein said control unit controls to change a focusing condition of said objective lens in accordance with a current value of said ion beam when section processing of said sample is executed; and wherein, when the current value of aid ion beam is equal to or larger than a predetermined value, said control unit sets a diameter of said ion beam to be larger than that at time when the current value of said ion beam is less than said predetermined value, and said control unit sets a scanning region of said ion beam to be narrowed in comparison with that at time when the current value of said ion beam is less than said predetermined value.

10. The ion beam apparatus according to claim 9 wherein said control means:

sets a desired processing region on a SIM image displayed on a CRT without regard to the size of ion beam is in use; and measures the beam radius of the larger ion beam in advance and stores a measured value in the control means.

11. The ion beam apparatus according to claim 9 wherein said control means is further adapted to generate a message indicating the beam type and further including a display on which said message is displayed.

12. The ion beam apparatus according to claim 11 wherein said message indicates whether the ion beam now set is an observation ion beam or a processing ion beam and if the processing ion beam is now set, to inform the operator of the size of the processing ion beam, thereby preventing an erroneous operation.

13. A sample processing method for executing section processing of a sample by irradiating the sample with an ion beam emitted from an ion source through an ion beam optical system, comprising:

when the current value of said ion beam is equal to or larger than a predetermined value, setting a diameter of said ion beam to be larger than that at time when the current value of said ion beam is less than said predetermined value, and setting a scanning region of said ion beam to be narrowed in comparison with that at time when the current value of said ion beam is less than said predetermined value.

14. A sample processing method according to claim 13 and further including:

setting a desired processing region on a SIM image displayed on a CRT without regard to beam diameter in use;

measuring and storing the beam radius of the larger ion beam in advance.

15. A sample processing method according to claim 14 and further including when processing with the larger diameter ion beam scanning a region obtained from the set processing region, by automatically subtracting an amount corresponding to the stored beam radius, with the larger radius ion beam to thereby attain a desired high processing accuracy.

16. A sample processing method according to claim 15 and further including displaying a message displaying the beam type.

17. A sample processing method according to claim 16 wherein said message indicates whether the ion beam now set is an observation ion beam or a processing ion beam and if the processing ion beam is now set, to inform the operator of the size of the processing ion beam, thereby preventing an erroneous operation.

18. A sample processing method according to claim 13 and further including displaying a message displaying the beam type.

19. A sample processing method according to claim 18 wherein said message indicates whether the ion beam now set is an observation ion beam or a processing ion beam and if the processing ion beam is now set, to inform the operator of the size of the processing ion beam, thereby preventing an erroneous operation.

* * * * *

UNITED STATES PATENT AND TRADEMARK OFFICE
CERTIFICATE OF CORRECTION

PATENT NO. : 7,084,399 B2  Page 1 of 1
APPLICATION NO. : 10/973304
DATED : August 1, 2006
INVENTOR(S) : Hiroyuki Muto et al.

It is certified that error appears in the above-identified patent and that said Letters Patent is hereby corrected as shown below:

Title Page, Item [63]    Change to read:
--Continuation of application No. 09/794,828, filed on Feb. 27, 2001, now Pat. No. 6,822,245.--

Before "(51)" add:
--(30) Foreign Application Priority Data
Jul. 18, 2000   (JP) ................2002-217096--.

| Column | Line | |
|--------|------|---|
| 1 | 4-5 | Delete entirely. |
| 1 | 6 | Change "continuation" to --Continuation--. |

Signed and Sealed this

Twentieth Day of March, 2007

JON W. DUDAS
*Director of the United States Patent and Trademark Office*